(12) United States Patent
Lisec et al.

(10) Patent No.: US 10,373,790 B2
(45) Date of Patent: Aug. 6, 2019

(54) MICRO-ELECTRO-MECHANICAL SYSTEM AND METHOD FOR PRODUCING THE SAME

(71) Applicant: Fraunhofer-Gesellschaft zur Foerderung der angewandten Forschung e.V., Munich (DE)

(72) Inventors: Thomas Lisec, Itzehoe (DE); Fabian Stoppel, Itzehoe (DE)

(73) Assignee: Fraunhofe-Gesellschaft zur Foerderung der angewandten Forschung e.V., Munich (DE)

( * ) Notice: Subject to any disclaimer, the term of this patent is extended or adjusted under 35 U.S.C. 154(b) by 445 days.

(21) Appl. No.: 15/235,462

(22) Filed: Aug. 12, 2016

(65) Prior Publication Data

US 2016/0351366 A1    Dec. 1, 2016

Related U.S. Application Data

(63) Continuation of application No. PCT/EP2015/052983, filed on Feb. 12, 2015.

(30) Foreign Application Priority Data

Feb. 14, 2014  (DE) .......................... 10 2014 202 763

(51) Int. Cl.
*H01L 41/09* (2006.01)
*H01H 57/00* (2006.01)
(Continued)

(52) U.S. Cl.
CPC ..... *H01H 59/0009* (2013.01); *F16K 99/0048* (2013.01); *H01H 47/00* (2013.01);
(Continued)

(58) Field of Classification Search
CPC .. H01H 57/00; H01H 59/0009; F16K 99/048; H01L 41/09
See application file for complete search history.

(56) References Cited

U.S. PATENT DOCUMENTS 4,620,124 A    10/1986 Farral et al.
4,710,732 A    12/1987 Hornbeck
(Continued)

FOREIGN PATENT DOCUMENTS

CN    101029966 A    9/2007
CN    102297690 A    12/2011
(Continued)

OTHER PUBLICATIONS

Nakatani et al., "PZT-Actuated Reliable RF-MEMS Switch Using Single-Crystal Silicon Asymmetric Beam", Proceedings of the Asia-Pacific Microwave Conference 2011, Dec. 5-8, 2011, pp. 554-557.
(Continued)

*Primary Examiner* — J. San Martin
(74) *Attorney, Agent, or Firm* — Perkins Coie LLP; Michael A. Glenn

(57) ABSTRACT

A micro-electro-mechanical system includes a deflectable actuator plate and an abutment area. An integral piezoelectric functional layer of the deflectable actuator plate is configured across an area $A_{PS}$ of the actuator plate. The deflectable actuator plate is configured to effect a hollow warp in at least a controlled or non-controlled state, wherein the abutment area is disposed facing a hollow side of the deflectable actuator plate defined by the hollow warp. The deflectable actuator plate is configured to provide, in the state in which the same effects the hollow warp, mechanical contact between the deflectable actuator plate and the abutment area. In the other state, the deflectable actuator plate is disposed spaced apart from the abutment area.

13 Claims, 18 Drawing Sheets

(51) Int. Cl.
*H01H 59/00* (2006.01)
*F16K 99/00* (2006.01)
*H01H 47/00* (2006.01)
*H01H 49/00* (2006.01)

(52) U.S. Cl.
CPC ............ *H01H 49/00* (2013.01); *H01H 57/00* (2013.01); *H01L 41/0926* (2013.01); *H01H 2057/006* (2013.01); *H01L 41/094* (2013.01)

(56) References Cited

U.S. PATENT DOCUMENTS

| | | | |
|---|---|---|---|
| 4,893,048 A | 1/1990 | Farrall | |
| 5,589,725 A | 12/1996 | Haertling | |
| 6,142,444 A | 11/2000 | Kluge | |
| 9,032,818 B2 * | 5/2015 | Campbell | G01L 1/148 |
| | | | 73/862.628 |
| 2002/0074901 A1 | 6/2002 | Johansson | |
| 2007/0195464 A1 | 8/2007 | Kwon et al. | |
| 2007/0231065 A1 | 10/2007 | Kim et al. | |
| 2008/0074728 A1 | 3/2008 | Ogikubo et al. | |
| 2008/0238257 A1 | 10/2008 | Kawakubo et al. | |
| 2011/0074248 A1 | 3/2011 | Hishinuma | |
| 2013/0033967 A1 | 2/2013 | Chuang et al. | |

FOREIGN PATENT DOCUMENTS

| | | |
|---|---|---|
| DE | 3544646 A1 | 6/1986 |
| DE | 19703415 A1 | 11/1998 |
| DE | 102005052132 A1 | 5/2007 |
| EP | 1527465 | 5/2005 |
| GB | 2353410 A | 2/2001 |

OTHER PUBLICATIONS

Polcawich et al., "Surface Micromachined Microelectromechanical Ohmic Series Switch Using Thin-Film Piezoelectric Actuators", IEEE Transactions on Microwave Theory and Techniques, vol. 55, No. 12, Dec. 2007, pp. 2642-2654.

* cited by examiner

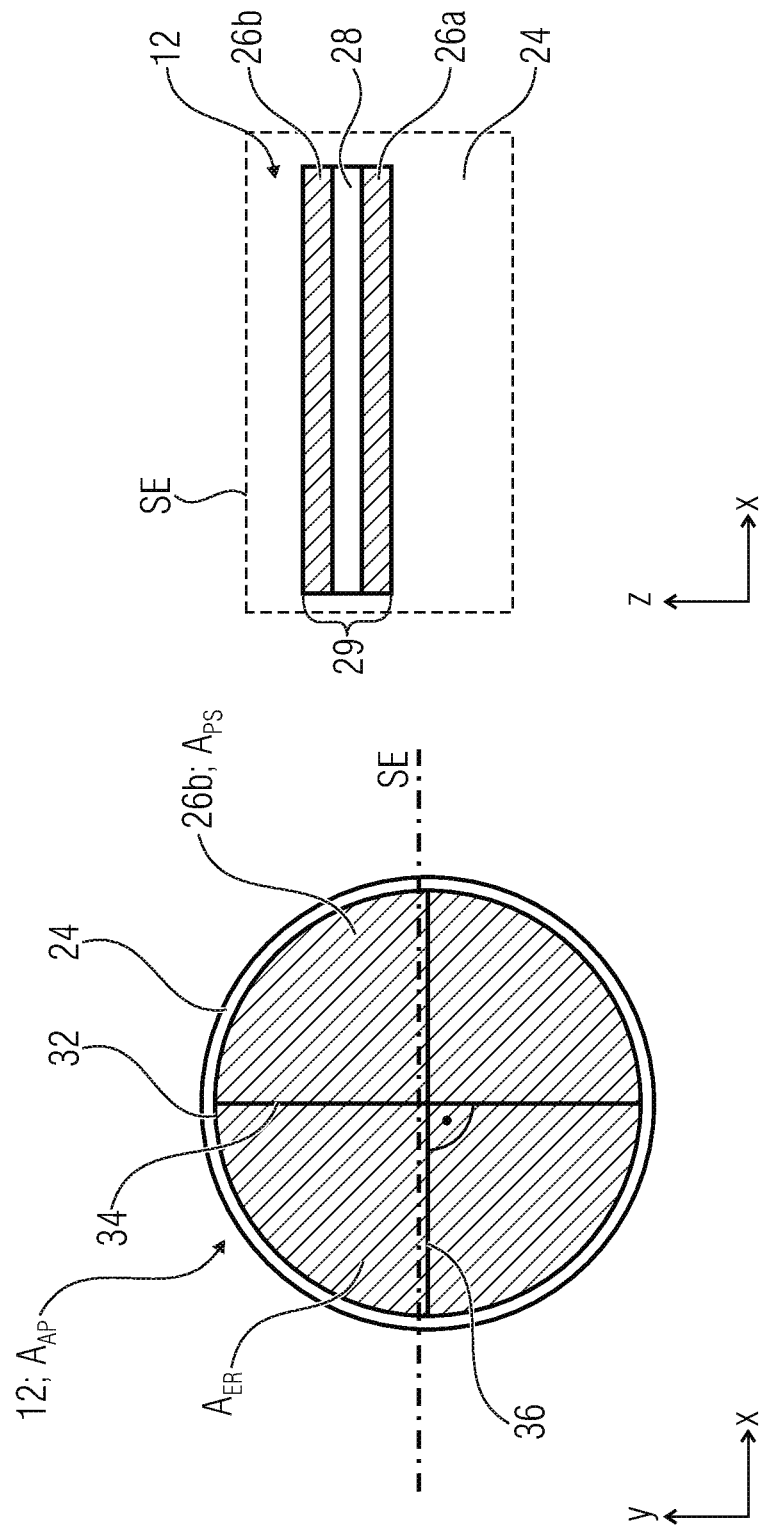

MICRO-ELECTRO-MECHANICAL SYSTEM AND METHOD FOR PRODUCING THE SAME

CROSS-REFERENCE TO RELATED APPLICATIONS

This application is a continuation of copending International Application No. PCT/EP2015/052983, filed Feb. 12, 2015, which claims priority from German Application No. 10 2014 202 763.2, filed Feb. 14, 2014, which are each incorporated herein in its entirety by this reference thereto.

BACKGROUND OF THE INVENTION

The present invention relates to a micro-electro-mechanical system (MEMS) with deflectable actuator plate and a method for producing the same. Further, the invention relates to an electric circuit and an apparatus for transporting a fluid. Further, the invention relates to piezoelectric actuators for MEMS applications.

Micro-electro-mechanical (MEMS) switches could play an important role in future communication systems. In particular ohmic switches are of interest, since the same can be used in a wide frequency range from DC up to several 10 GHz. However, there are only a few commercial applications in niche markets, such as high-frequency measurement technology or the military. They all have in common that they have to be switched almost without power (cold switching) in order to obtain a long life time. Even at low load, due to discharges (arcing), erosion effects will occur at the contact areas up to fusing of the same (cold welding). Soft metals, such as gold, have a particularly strong tendency to fuse, but necessitate only low forces (<50 μN) to obtain a contact resistance of less than 1Ω. Hard metals, such as platinum (Pt) or ruthenium (Ru) are more resistant but necessitate higher forces (>100 μN for 2-3Ω contact resistance). High contact forces up to 1 mN are obtained with electrostatic drives, but at the expense of high voltages (50-150 V). Recently, piezoelectric drives have been examined more and more. The same can generate significant forces at significantly lower voltages, in particular based on lead (P) zirconate (Z) titanate (T)—PZT. The forces obtained by the devices described so far are, however, comparatively low.

Piezoelectrically operated ohmic switches can be implemented as actuators having fixedly cantilevered beam elements, at the movable end of which a contact resides. The beam structure consists of a passive layer with the (active) piezoelectric material thereon (including electrodes). If a voltage is applied to the latter, the same will expand laterally or will contract, depending on the polarity of the applied voltage and the beam warps. In this regard, reference is made to documents [1] and [2].

In MEMS devices having an electrostatic drive, such beam structures are very common, since the same operate well with this drive principle. In the simplest case, a detached metallic beam is pulled against a fixed electrode area by applying a voltage. The resulting force can be transmitted to a contact at the beam end. Piezoelectric beam actuators, however, form a stack of a passive layer and the piezoelectric material (active layer). Due to the expansion or contraction of the active layer at the beam level, analogously to the thermomechanical effect, warping of the actuator structure can be obtained. Here, the generated force is only partly transferred to the contact.

Approaches as known, for example, from US 2002/0074901 try to increase a force of the respective beam elements via lateral interruption of the beam elements and/or to obtain deflections having lower space requirements. However, this necessitates complicated control of the individual beam elements.

Thus, a concept for establishing or releasing a mechanical contact allowing high contact forces and simple control would be desirable.

SUMMARY

According to an embodiment, an MEMS may have: a deflectable actuator plate; and an abutment area; wherein an integral piezoelectric functional layer of the deflectable actuator plate is configured across an active area of the deflectable actuator plate; wherein the deflectable actuator plate includes a controlled state (on-state) and a non-controlled state (off-state) and effects a hollow warp in at least one of the two states; wherein the abutment area of a hollow side is disposed facing a hollow side of the deflectable actuator plate; wherein the deflectable actuator plate is configured to provide in the state in which the same effects the hollow warp, mechanical contact between the deflectable actuator plate and the abutment area; and wherein the deflectable actuator plate is spaced apart from the abutment area in the other state; wherein an elliptical ring exists, which overlaps by more than 95% with the active area and whose elliptical ring area takes up at least 60% of a total area of the deflectable actuator plate; wherein the elliptical ring includes an outer elliptical trajectory with a main axis and a minor axis disposed perpendicularly to the main axis; and wherein a ratio between the main axis and the minor axis includes a value in the range of greater than or equal to 0.25 and less than or equal to 4.

According to another embodiment, an electrical circuit may have: an above-stated inventive MEMS 1; and a control unit coupled to the MEMS and configured to control the deflectable actuator plate.

According to another embodiment, an MEMS may have: a deflectable actuator plate; and an abutment area; wherein an integral piezoelectric functional layer of the deflectable actuator plate is configured across an active area of the deflectable actuator plate; wherein the deflectable actuator plate includes a controlled state (on-state) and a non-controlled state (off-state) and effects a hollow warp in at least one of the two states; wherein the abutment area of a hollow side is disposed facing a hollow side of the deflectable actuator plate; wherein the deflectable actuator plate is configured to provide in the state in which the same effects the hollow warp, mechanical contact between the deflectable actuator plate and the abutment area; wherein the deflectable actuator plate is spaced apart from the abutment area in the other state; wherein the deflectable actuator plate and the abutment area include contact electrodes in at least one contact area each in which the mechanical contact between the abutment surface and the deflectable actuator plate can be provided with contact electrodes; and wherein the mechanical contact can be provided at a first time in a primary contact area and wherein the deflectable actuator plate and the abutment area include a secondary contact area and electrodes disposed thereon, wherein in the state, in which the deflectable actuator plate effects the hollow warp, an electrical contact can be provided between the deflectable actuator plate and the abutment area in the secondary contact area at the second time, wherein the second time follows the first time when the mechanical contacts are provided in the primary contact area and the secondary contact area, and wherein the first time follows the second time when the mechanical contacts are released in the primary contact area and the secondary contact area.

According to another embodiment, an electrical circuit may have: an above-stated inventive MEMS; and a control unit coupled to the MEMS and configured to control the deflectable actuator plate.

According to another embodiment, an MEMS may have: a deflectable actuator plate; and an abutment area; wherein an integral piezoelectric functional layer of the deflectable actuator plate is configured across an active area of the deflectable actuator plate; wherein the deflectable actuator plate includes a controlled state (on-state) and a non-controlled state (off-state) and effects a hollow warp in at least one of the two states; wherein the abutment area of a hollow side is disposed facing a hollow side of the deflectable actuator plate; wherein the deflectable actuator plate is configured to provide in the state in which the same effects the hollow warp, mechanical contact between the deflectable actuator plate and the abutment area; wherein the deflectable actuator plate is spaced apart from the abutment area in the other state; wherein the MEMS further includes a further abutment area which is disposed opposite to the abutment area, and wherein the abutment area or the further abutment area includes a fluid inlet which is configured to let a fluid pass into a volume between the abutment area and the further abutment area and wherein the abutment area or the further abutment area includes a fluid outlet that is configured to let the fluid exit from the volume, wherein an amount of a fluid flow between the fluid inlet and the fluid outlet is variable based on the mechanical contact.

According to another embodiment, an apparatus for transporting a fluid may have: an above-stated inventive MEMS; and a control unit coupled to the MEMS and configured to control the deflectable actuator plate.

According to another embodiment, an MEMS may have: a deflectable actuator plate; and an abutment area; wherein an integral piezoelectric functional layer of the deflectable actuator plate is configured across an active area of the deflectable actuator plate; wherein the deflectable actuator plate includes a controlled state (on-state) and a non-controlled state (off-state) and effects a hollow warp in at least one of the two states; wherein the abutment area of a hollow side is disposed facing a hollow side of the deflectable actuator plate; wherein the deflectable actuator plate is configured to provide in the state in which the same effects the hollow warp, mechanical contact between the deflectable actuator plate and the abutment area; wherein the deflectable actuator plate is spaced apart from the abutment area in the other state; wherein the MEMS further includes a further abutment area which is disposed opposite to the first abutment area and wherein the deflectable actuator plate is suspended on the further abutment area by means of anchor elements; and wherein the anchor elements are disposed equidistantly on an outer cladding area of the deflectable actuator plate.

According to another embodiment, an electrical circuit may have: an above-stated inventive MEMS; and a control unit coupled to the MEMS and configured to control the deflectable actuator plate.

According to another embodiment, a method for producing a micro-electro-mechanical system (MEMS) may have: providing a deflectable actuator plate with an integral piezoelectric functional layer which is configured across an active area of the deflectable actuator plate; providing an abutment area; wherein providing of the actuator plate is performed such that an elliptical ring exists, which overlaps by more than 95% with the active area and whose elliptical ring area takes up at least 60% of a total area of the deflectable actuator plate; such that the elliptical ring includes an outer elliptical trajectory with a main axis and a minor axis disposed perpendicularly to the main axis; and such that a ratio between the main axis and the minor axis includes a value in a range of greater than or equal to 0.25 and less than or equal to 4.

It is the core idea of the present invention to have found out that the above object, such as increasing mechanical contact forces and/or simplifying the control can be obtained by increasing an area of piezo-active materials and reducing a proportion of dimensions, such as between length and width of the actuator and that further a deflectable actuator plate which effects, in one of her operating states, a hollow warp along two linearly independent spatial directions increases the contact forces further, such that transversal contractions in the piezoelectric functional area can be used.

By converting the transversal contractions of the piezoelectric functional area into a hollow warp in addition to a curvature in a direction which is linearly independent to a direction of the transversal contraction, apart from an actuator force, increased structural rigidity can be used for establishing a contact, such that contact forces are increased and/or contact bouncing of the mechanical contacts can be reduced.

According to an embodiment of the present invention, an actuator plate can be deflected with respect to an abutment area. The deflectable actuator plate comprises an integral piezoelectric functional layer covering the actuator plate at least partly. The deflectable actuator plate comprises a controlled and non-controlled state and is configured to effect a hollow warp in at least one of the two states. The abutment area is disposed in a hollow side facing the deflectable actuator plate. In the state where the actuator plate effects the hollow warp, the deflectable actuator plate can provide a mechanical contact to the abutment area. In another state, the deflectable actuator plate is spaced apart from the abutment area.

It is an advantage of this embodiment that based on the hollow warp a contact force between abutment area and deflectable actuator plate can be great with respect to a beam element and at the same time simple control of the piezoelectric functional layer is enabled, for example by two operating states "controlled (on)" and "non-controlled (off)".

According to a further embodiment of the present invention, the piezoelectric functional layer has an active area into which an elliptical ring can be projected, which overlaps by more than 95% with the area of the piezoelectric functional layer and whose area takes up at least 50% or 60% of an area of the deflectable actuator plate.

It is an advantage of this embodiment that an ellipse enables a formation of the active area and hence an effectuation of the hollow warp along two linearly independent directions.

BRIEF DESCRIPTION OF THE DRAWINGS

Embodiments of the present invention will be detailed subsequently referring to the appended drawings, in which:

FIG. 1c is the MEMS of FIG. 1a in a left portion of the figure in a schematic top view of the deflectable actuator plate with a sectional plane and in a right area of the figure a schematic side sectional view in the sectional plane;

DETAILED DESCRIPTION OF THE INVENTION

Before embodiments of the present invention will be discussed in detail based on the drawings, it should be noted that identical, functionally equal or equal elements, objects and/or structures are provided with the same reference numbers in the different figures, such that the description of these elements illustrated in different embodiments is interchangeable or can be applied to each other.

A state where an electric voltage is applied to a piezoelectric functional layer will be referred to as "on" or "on-state". A state where the piezoelectric functional layer is without voltage will be referred to below as "off" or "off-state". The following discussions describe deflectable actuator plates such that the same are configured to effect a hollow warp and to provide mechanical contact to an abutment area in the on-state and to be spaced apart from the abutment area in the off-state. It is obvious that based on mechanical pretensions or electrical bias in the piezoelectric functional layer and/or mechanical tensions between the piezoelectric functional layer and the substrate of the deflectable actuator plate where the piezoelectric functional layer is disposed and/or a mechanical pretension of the deflectable actuator plate, the same can be implemented to effect the hollow warp in the off-state and to be spaced apart from the first abutment area in the on-state. In the state where the deflectable actuator plate is spaced apart from the first abutment area, the same can, for example, be implemented in a planar manner or can have a curvature or hollow warp. This means that explanations regarding the on-state and regarding the off-state are interchangeable.

Figure 1A:
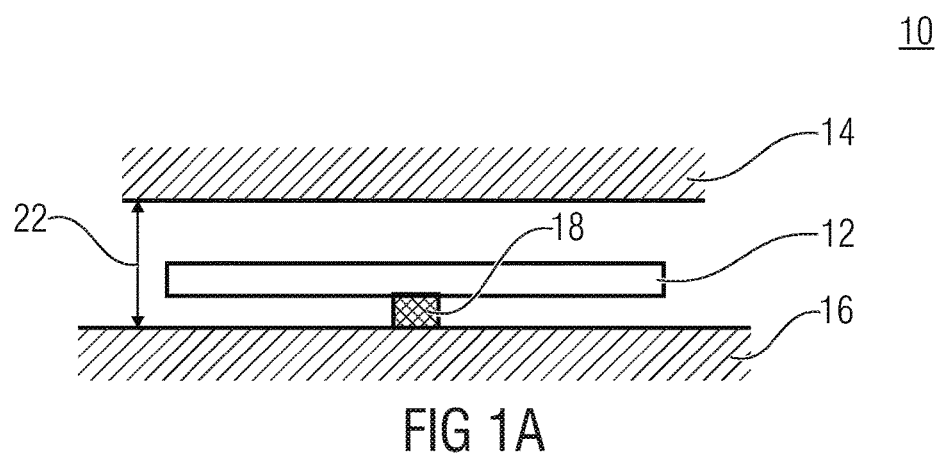
FIG. 1a is a schematic side sectional view of a micro-electro-mechanical system (MEMS) with a deflectable actuator plate in an off-state according to an embodiment of the present invention.

FIG. 1a shows a schematic side sectional view of a micro-electro-mechanical system (MEMS) 10 with a deflectable actuator plate disposed between an abutment area or a first abutment area 14 and a further, i.e., second abutment area 16. The deflectable actuator plate 12 is connected to an anchor 18. The anchor 18 is firmly fixed to the second abutment area 16 on a side facing away from the deflectable actuator plate 12, such that the deflectable actuator plate 12 is supported on the second abutment area 16 by means of the anchor 18. The anchor can also be integrally formed with the second abutment area 16 and/or be referred to as anchor element.

In other words, the anchor 18 is configured to provide rigid anchoring of the deflectable actuator plate 12. An extent to which the deformation of the deflectable actuator plate 12 is influenced by the coupling to the anchor 18 can be influenced or reduced by reducing an area where the anchor 18 is connected to the deflectable actuator plate 12. The anchor 18 can also be disposed apart from a central position of the deflectable actuator plate 12 as will be shown below.

The first abutment area 14 and the second abutment area 16 are disposed, for example, parallel to one another and have a distance 22 to one another. The deflectable actuator plate 12 includes a piezoelectric actuator and is configured to effect a hollow warp when an electric voltage is applied to the piezoelectric actuator. In FIG. 1a, the deflectable actuator plate 12 is illustrated in a state where the deflectable actuator plate 12 is spaced apart from the first abutment area 14. The distance 22 can be in a range from 0.01 to 50 µm, 0.05 to 10 µm or 0.1 to 5 µm or even at greater values and can have, for example, a value of 50 µm.

Figure 1B:
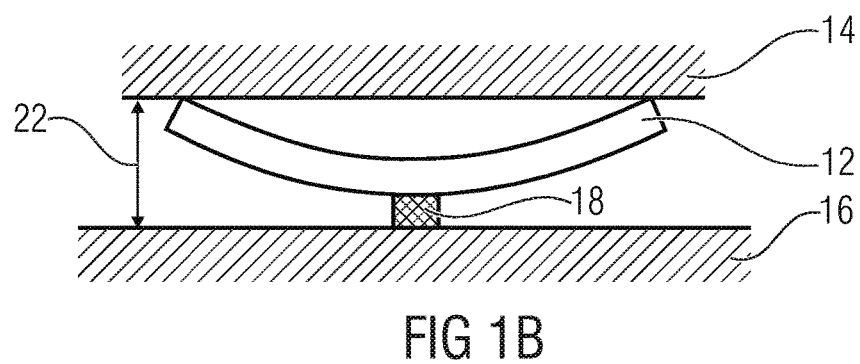
FIG. 1b is a schematic side sectional view of the (MEMS) of FIG. 1a in an on-state.

FIG. 1b shows a schematic side sectional view of the MEMS 10 in an on-state. The distance 22 is unamended with respect to FIG. 1a based on fixed clamping of the first abutment area 14 and the second abutment area 16. Alternatively, the first abutment area 14 and/or the second abutment area 16 can be disposed in a soft manner, i.e., in a flexible manner with respect to the respective other abutment area 16 or 14. This means that the distance 22 can be variable based on a force by which the deflectable actuator plate 12 establishes the mechanical contact to the first abutment area 14 (contact force). In other words, based on the contact force by which the mechanical contact is established, the first abutment area 14 can be pushed away from the second abutment area 16 or vice versa.

The deflectable actuator plate 12 comprises a geometry having a total area $A_{AP}$ which is covered by a piezoelectric functional layer across an active area $A_{PS}$. As described in the subsequent figures, an elliptical ring exists which has an elliptical ring area $A_{ER}$ overlapping with its elliptical ring area $A_{ER}$ by more than 95% with the active area $A_{PS}$ and whose elliptical ring area $A_{ER}$ takes up at least 60% of the total area $A_{AP}$. In the following, this will sometimes be referred to as "elliptical ring condition". The elliptical ring can also be thought of as an area projected onto the deflectable actuator plate 12. When the elliptical ring condition is fulfilled, this means that the plate effects, for a desired high contact force, a hollow warp with respect to the abutment area 14.

Alternative embodiments provide deflectable actuator plates for which the elliptical ring with its elliptical ring area $A_{ER}$ overlaps by more that 80% or 90% with the active area $A_{PS}$ and whose elliptical ring area $A_{ER}$ takes up at least 50%, 55% of the total area $A_{AP}$.

The elliptical ring comprises at least an external elliptical trajectory with a main axis and a minor axis perpendicular thereto, wherein the main axis connects the two main vertexes and the minor axis connects the two minor vertexes of the outer elliptical trajectory. A ratio between the main axis and the minor axis has a value of more than or equal to 0.25 and less than or equal to 4. If the ratio has, for example, a value of 1, the elliptical ring can be formed in a circular manner. The deflectable actuator plate 12 and/or the piezoelectric functional layer can be, for example, formed in a circular manner. A circular deflectable actuator plate 12 enables mechanical contact between the deflectable actuator plate 12 and the first abutment area 14 in a circular contact area. The first abutment area 14 is disposed facing a hollow side of the deflectable actuator plate 12. The hollow side is the main side of the deflectable actuator plate 12 which has, for example in a side sectional view, a lower radius of curvature when the deflectable actuator plate 12 effects the hollow warp. The inner elliptical trajectory can be emitted, in that case the elliptical ring degenerates the to an ellipse. The "elliptical ring condition" provides that the elliptical ring has a sufficient width. A sufficient width can, for example, mean a value of the elliptical ring of at least 10 µm, 100 µm, 1000 µm or 5000 µm.

FIG. 1c shows in a left portion of the figure a schematic top view of the deflectable actuator plate 12 with a sectional plane SE and in a right portion of the figure a schematic side sectional view in the sectional plane SE.

The deflectable actuator plate 12 includes a substrate 24. The substrate 24 comprises a cylindrical volume in the shape of a round plate. The cylindrical plate comprises two main sides and a cladding side, wherein the main sides are the lid areas of the cylinder body. A first electrode 26a which partly covers the substrate 24 is disposed on a main side of the substrate 24. Alternatively, the first electrode 26 can also completely cover the substrate 24 or project beyond the same. A piezoelectric material 28 is disposed on a main side of the first electrode 26a facing away from the substrate 24, which is covered by a second electrode 26b on a main side facing away from the first electrode 26a. The first electrode 26a, the second electrode 26b and the piezoelectric material 28 form a piezoelectric functional layer 29. Based on the electric voltage applied between the first electrode 26a and the second electrode 26b, the piezoelectric functional layer 29 is implemented to deform the substrate 24 and hence to induce the hollow warp in the deflectable actuator plate. A warping direction of the deflectable actuator plate 12 can be determined by a series of passive and active layers in the actuator stack. Such a configuration of substrate 2 and piezoelectric functional layer can be referred to as bimorph. Alternatively, the substrate can also be a piezoelectric functional layer. Alternatively or additionally, a further piezoelectric functional layer can be disposed on a main side of the substrate 24 facing away from the piezoelectric functional layer 29 and can, for example, be controllable independent of the piezoelectric functional layer. Such a configuration can be referred to as trimorph. Alternatively or additionally, one or several further functional layers can also be disposed on the piezoelectric functional layer 29 and can form, for example, a stack. By means of a stack of piezoelectric functional layers, an actuator force can be increased with respect to an actuator force by means of the piezoelectric functional layer 29.

The piezoelectric functional layer 29 is integrally formed. An integral piezoelectric functional layer 29 means that, for example, the piezoelectric material 28 can be formed integrally. Alternatively, the piezoelectric material 28 can also be formed of several elements and can be enclosed by integral electrodes 26a and 26b. Alternatively, the piezoelectric material 28 and the electrodes 26 and/or 26b can comprise several elements and an electric field for controlling the piezoelectric material can be provided by several commonly controlled electrode segments. This means that the piezoelectric functional layer 29 is planarly controllable at one point in time. This will be referred to below as integral piezoelectric functional layer 29.

The deflectable actuator plate 12 comprises a total area $A_{AP}$ of a main side area. The first electrode 26a, the piezoelectric material 28 and the second electrode 26b comprise an active main side area $A_{PS}$ which relates to the area of the piezoelectric functional layer 29 which can be activated, i.e. controlled, by means of electrodes 26a and 26b, i.e., controllable. An elliptical ring 32 having the elliptical ring area $A_{ER}$ overlaps with the active area $A_{PS}$, for example by 100% and has an elliptical ring area $A_{ER}$. The elliptical ring area $A_{ER}$ takes up at least 50% and at least 60%, for example more than 80% and more than 90% of the total area $A_{AP}$.

The elliptical ring 32 has a main axis 34 and a minor axis 36, wherein the main axis 34 and the minor axis 36 are disposed at a right angle to each other. When both focal points of the outer elliptical ring 32 are mapped onto the same point, the elliptical ring 32 can turn into a circle whose main axis 34 and minor axis 36 each have a length corresponding to the diameter of the circle, such that the main axis 34 and the minor axis 36 have a ratio of 1:1 and hence a value of 1. Further, the elliptical ring 32 has a width between an outer elliptical trajectory and an inner elliptical trajectory. The width corresponds, for example, to the radius of the circle, such that the elliptical ring area $A_{ER}$ is a full area and corresponds to the active area $A_{PS}$.

The deflection of the piezoelectric functional layer can result in a deflection of the deflectable actuator plate along the main axis 34 and along the minor axis 36 and hence to a hollow warp of the deflectable actuator plate 12. The hollow warp can be a spherical warp, for example when the hollow warp is rotationally symmetric with respect to a geometric center of the main side of the deflectable actuator plate 12.

Alternative embodiments show elliptical rings having a ratio between the main axis and the minor axis having a value in the range of more than or equal to 0.25 and less than or equal to 4, greater than or equal to 0.3 and less than or equal to 3 or greater than or equal to 0.35 and less than or equal to 2.85, greater than or equal to 0.5 and less than or equal to 2, greater than or equal to 0.75 and less than or equal to 1.3.

The ratio of main and minor axis within this range can be expressed such that the piezoelectric functional layer has a specific dimension in a second direction, for example an y-direction, with respect to a dimension in a first direction, for example an x-direction perpendicular thereto. At a ratio between main axis 34 and minor axis 36 having a value of 1, for example, a width in x-direction and a length in y-direction are the same.

The specific dimension in the second direction allows the effectuation of the hollow warp for providing the high contact forces.

An actuator geometry, for example with a round deflectable actuator plate 12, can selectively provide high forces. In particular, this can be enabled by the fact that a lever length in a direction between a supporting point where, for example the anchor 18 is disposed and a contact point or contact area where the mechanical contact can be provided between the deflectable actuator plate and the abutment area 14, is smaller or shorter than the respective dimension of the actuator along this direction, for example the diameter. A lever length can have approximately the length of the circular radius, or approximately the length of half the main or minor axis 34 or 36 while the actuator has the diameter as dimension in this direction.

A shortened level length allows an increased structural rigidity along the shortened lever length, such that a contact force by which the mechanical contact can be provided can be increased. Based on a fixed cantilevered anchoring by means of the anchor 18, high forces can also be generated at greater distances 22, for example 5 μm or 10 μm or 20 μm or 50 μm.

An actuator having a main side geometry where the dimension of the actuator in a first direction, for example a width, contributes essential effects with respect to a dimension in another direction, for example a length, can be referred to as three-dimensional (3D) actuator. A 3D actuator, for example the deflectable actuator plate 12, can be configured to provide the hollow warp based on a usage of the expansion or contraction of the piezoelectric functional area in two or more linearly independent spatial directions along a main side of the actuator, for example a hollow side.

In other words, the deflectable actuator plate 12 can be formed as stack including a passive layer 24 and the piezoelectric material 28 embedded between two electrodes 26a and 26b. The warping direction can be adjustable based on the side of the stack where the active piezoelectric layer resides. FIG. 1a-c show schematic side or cross-sectional views through an actuator based on a circular plate. The deflectable actuator plate 12 is between two bounding surfaces 14 and 16.

In other words, FIGS. 1a and 1b show a round actuator residing between two bounding surfaces (the abutment areas 14 and 16 at defined distances. If the actuator is activated and warped, mechanical contact with the upper bounding surface, i.e., the first abutment area 14, results. In the case that the deflectable actuator plate 12 is implemented as round plate, the mechanical contact can be formed along the entire edge of the deflectable actuator plate 12. The distance 22 can be selected such that a location where the mechanical contact is formed at the first abutment area 14 can be adjusted. Thus, for example in FIG. 1b, an increased distance 22 can have the effect that the hollow warp effected by the deflectable actuator plate 12 is increased, a distance between the two illustrated contact points or a radius or a curve of a circumferential contact area is reduced.

In other words, by using the hollow warp or a spherical warping, with a given area, higher contact forces can be generated than compared to conventional designs according to conventional technology, for example a beam having a length corresponding to a diameter of an actuator plate. The warp gives a contribution to the structural rigidity along two linearly independent directions. This means that the actuator plate does not easily buckle.

The MEMS 10 can be, for example, controlled via a control means. The control unit can be configured to control the deflectable actuator plate, for example by providing electric energy. The control unit can be coupled, i.e., connected to the MEMS.

Alternative embodiments provide MEMS with piezoelectric functional layers comprising an area into which an elliptical ring can be projected, which overlaps by more than 96%, 97% or 99% with the area of the piezoelectric functional layer and whose area at the same time takes up at least 50%, 70%, 80% or 85% of an area of the deflectable actuator plate.

Figure 2A:
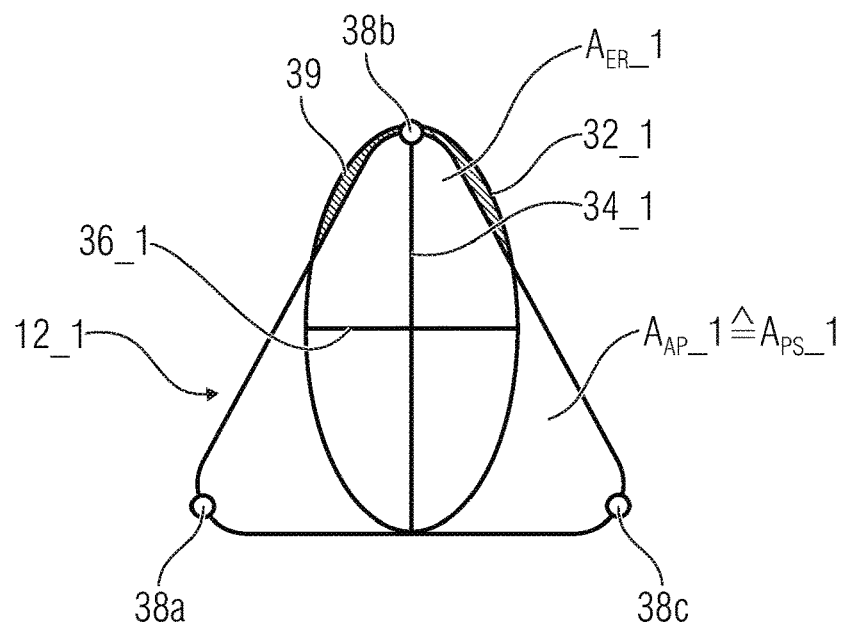
FIG. 2a is a schematic top view of a deflectable actuator plate comprising, according to an embodiment of the present invention, an approximately triangular geometry of the main side with an area.

FIG. 2a shows a schematic top view of a deflectable actuator plate 12_1 which comprises an approximately triangular geometry of the main side with a total area $A_{AP}\_1$. A piezoelectric functional layer completely covers a main side of the deflectable actuator plate 12_1, such that the total area $A_{AP}\_1$ corresponds to an active area $A_{AP}\_1$ of the piezoelectric functional layer. An elliptical ring 32_1 or its elliptical ring area $A_{ER}\_1$ overlaps by more than 95% with the active area $A_{PS}\_1$. Areas 39 where the elliptical ring does not overlap with the active area have a (remaining) proportion of less than 5%. A ratio of a main axis 34_1 of the elliptical ring 32_1 to a minor axis 36_1 has a value of approximately 0.54 or 1.85. At rounded corners of the triangular geometry, the deflectable actuator plate 12_1 has contact areas 38a, 38b and 38c with one electrode each. If the deflectable actuator plate 12_1 effects a hollow warp in a direction of a viewer of FIG. 2a, the mechanical contact can be provided between the electrodes and an abutment area or electrodes disposed thereon.

Alternative embodiments provide deflectable actuator plates whose entire area overlaps with an elliptical ring by at least 60%, 70%, 80%, 90%.

It is an advantage of this embodiment that electrodes can have, for example, different electric potentials, such that based on a mechanical contact between the electrodes in the contact areas 38a-c and electrodes at the abutment area different current paths can be opened or closed. In absence of electrodes, mechanical contact areas can remain at locations of the same such that, compared to the embodiments of FIG. 1, an area of a mechanical contact area, for example of a contact ring, is reduced to areas of the three contact areas.

Figure 2B:
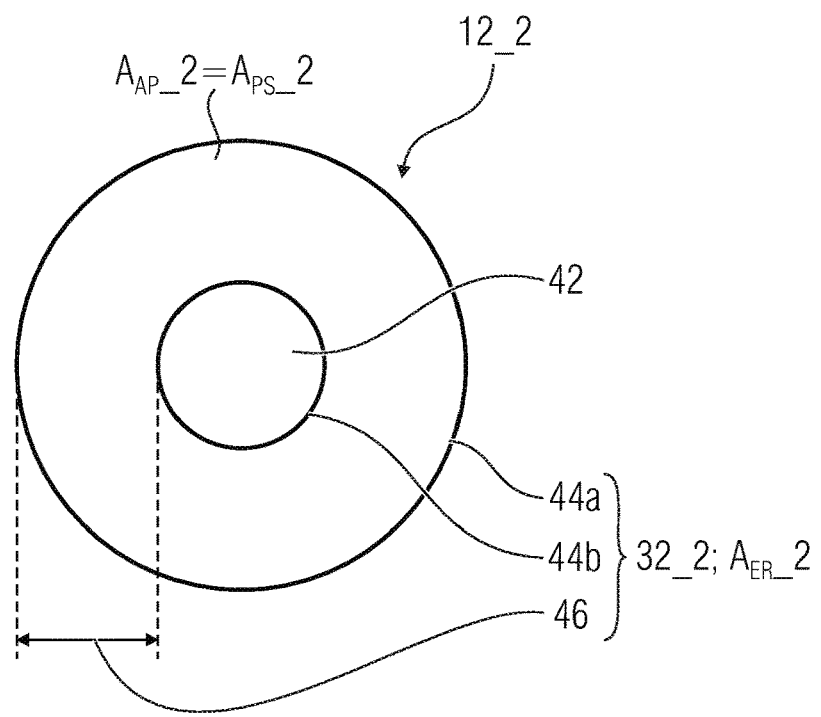
FIG. 2b is a schematic top view of a deflectable actuator plate with a round main side geometry comprising an inner recess according to an embodiment of the present invention.

FIG. 2b shows a schematic top view of a deflectable actuator plate 12_2 with a round main side geometry comprising an inner recess 42. The inner recess 42 also has a round shape. Alternatively, the recess 42 can have any shape. The piezoelectric functional layer covers the substrate of the deflectable actuator plate 12_2 completely, such that a total area $A_{AP\_2}$ of the deflectable actuator plate corresponds to an active area $A_{PS\_2}$ of a piezoelectric functional layer. If the deflectable actuator plate 12 in FIG. 1c and the deflectable actuator plate 12_2 in FIG. 2b have the same radii of external perimeters, the total area $A_{AP\_2}$ can correspond to the total area $A_{AP}$ minus an area of the recess 42.

An elliptical ring 32_2 has an outer elliptical trajectory 44a and an inner elliptical trajectory 44b. The inner elliptical trajectory 44b can be, for example, determined by a curve of the recess 42 or a distance between the outer elliptical trajectory 44a and the inner elliptical trajectory 44b. The outer elliptical trajectory 44a and the inner elliptical trajectory 44b run parallel to one another and have a distance 46 to one another. The distance 46 can also be referred to as width of the elliptical ring 32_2. An elliptical ring area $A_{ER\_2}$ can be congruent with the total area $A_{AP\_2}$ and the active area $A_{PS\_2}$, such that the elliptical ring area $A_{ER\_2}$ overlaps by more than 95%, for example 100% with the active area $A_{PS\_2}$. The elliptical ring area $A_{ER\_2}$ can take up 100% of the area $A_{AP\_2}$ (total area) of the deflectable actuator plate 12_2. A width of the elliptical ring 32_1 in FIG. 2a defined by the minor axis 36_1 is, for example, greater than or equal to half of a dimension of the main axis 34_1, such that the elliptical ring 32_1 forms a full area.

Figure 2C:
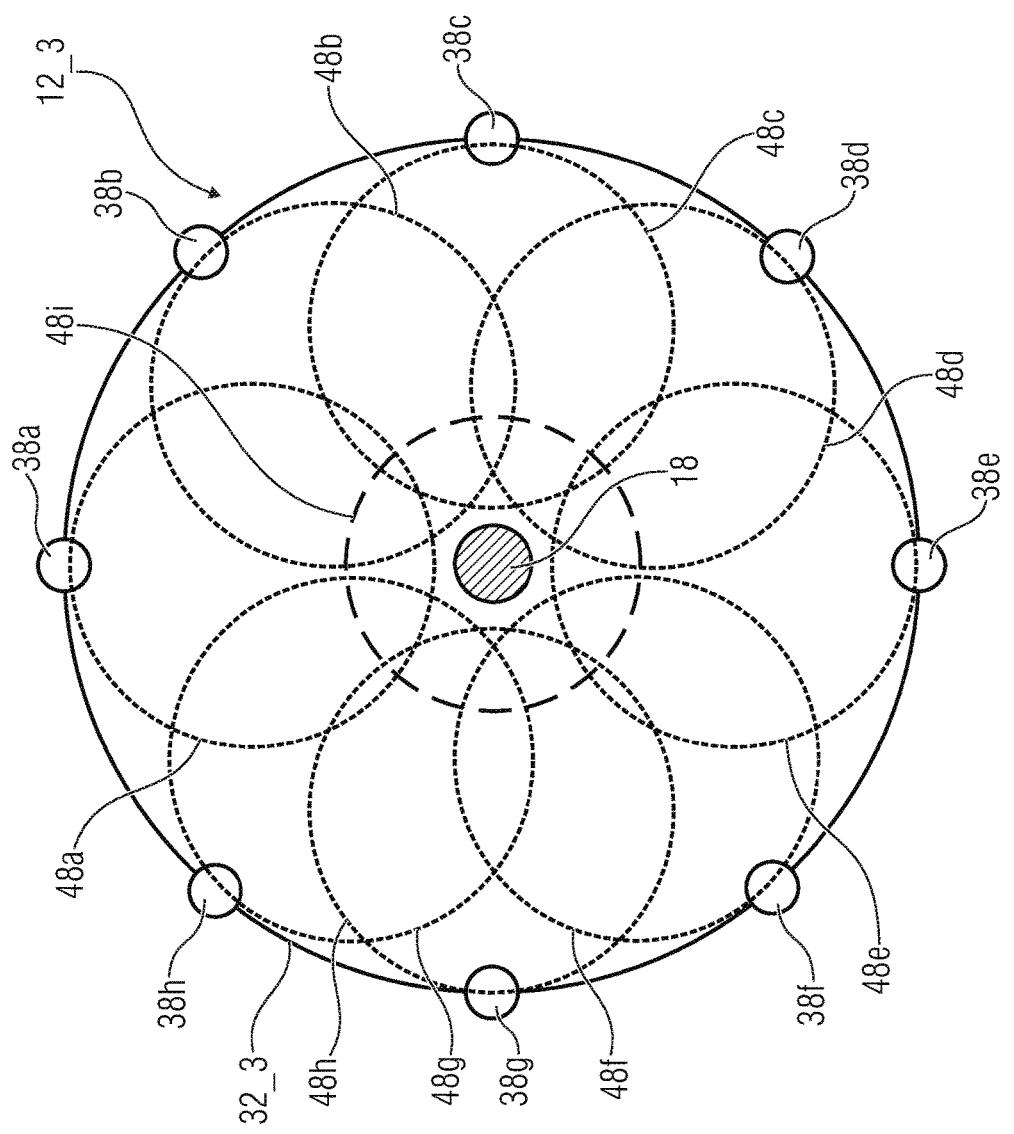
FIG. 2c is a schematic top view of a deflectable actuator plate according to an embodiment of the present invention whose geometry can be described by an equidistant overlap of a plurality of circles along a circular trajectory.

FIG. 2c shows a schematic top view of a deflectable actuator plate 12_3 whose geometry can be described, for example, by an equidistant overlap of a plurality of circles 48a-with having same or differing diameters along a circular trajectory and being concentric with respect to the geometrical center of the circle. The deflectable actuator plate 12_3 comprises a plurality of contact areas 38a-h where electrodes are disposed. The anchor 18 is disposed in a center of the deflectable actuator plate 12_3. If the piezoelectric functional layer is disposed, for example, at the deflectable actuator plate 12_3 in the direction of the viewer, the hollow warp can, for example, also be effected in the direction of the viewer. The deflectable actuator plate can at least partly enclose the anchor 18 in the state where the same effects a hollow warp, i.e., the hollow warp can be effected in the direction of the anchor 18. The contact areas 38a-h or electrodes are disposed along a circular trajectory which corresponds to an outer elliptical trajectory of an elliptical ring 32_3. The contact areas 38a-h can, for example, also be point-shaped.

In other words, a contact ring as provided, for example, by the deflectable actuator plate 12 in FIG. 1 can be divided into several contact areas. The contact areas 38a-h can be disposed equidistantly with varying distances to one another on the circular trajectory. Alternatively, contact areas 38a-h can be disposed around the circular trajectory within a tolerance range. The tolerance range can have a value of less than ±25%, less than ±15% or less than ±5% of the diameter of the circular trajectory around the same.

Figure 2D:
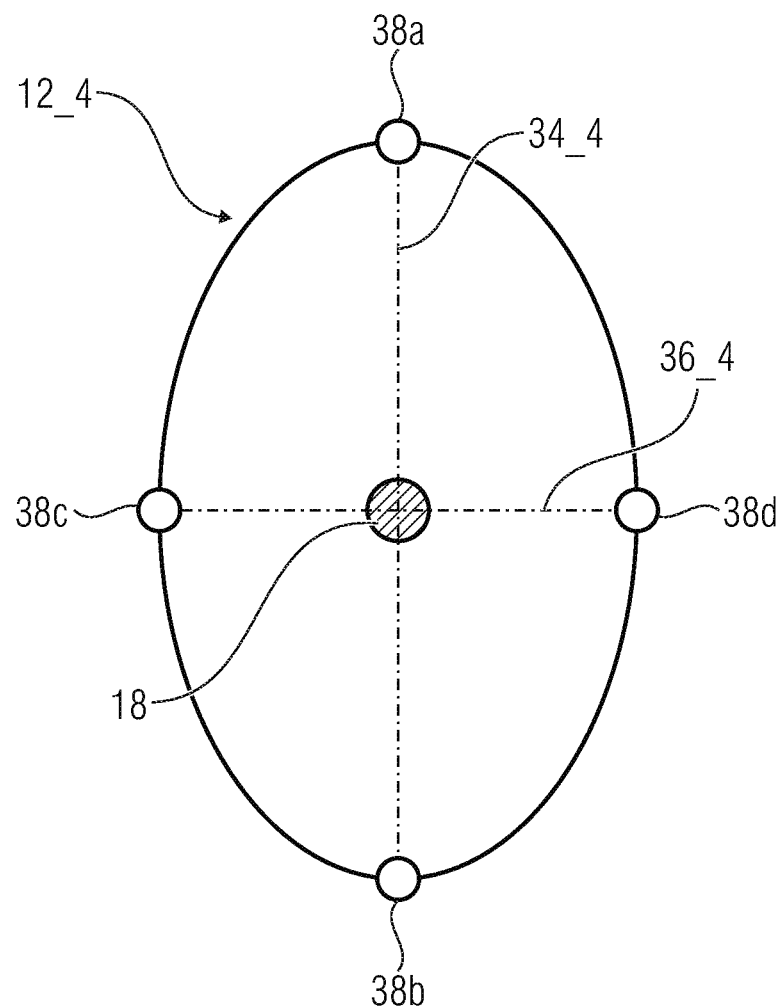
FIG. 2d is a schematic top view of a deflectable actuator plate according to an embodiment of the present invention with a main side comprising an elliptical shape.

FIG. 2d shows a schematic top view of a main side of deflectable actuator plate 12_4 having an elliptical shape. The contact areas 38a-d are disposed along the elliptical perimeter, i.e., along an elliptical trajectory. The contact areas 38a-d each comprise electrodes and are configured to provide an electric contact with electrodes disposed on a first abutment area. The contact areas 38a and 38b are disposed at locations of the main vertexes of the elliptical trajectory, such that a main axis 34_4 of the elliptical trajectory runs between the contact areas 38a and 38b. The electrodes of the contact areas 38a and 38b form a primary contact area. The electrodes of the contact areas 38c and 38d form a secondary contact area.

The electrodes in the contact areas 38c and 38d are disposed at locations of the minor vertexes of the elliptical trajectory, such that a minor axis 36_4 runs between the contact areas 38c and 38d. The main axis 34_4 and the minor axis 36_4 have a ratio of unequal 1. This means the main axis 34_4 has a greater length than the minor axis 36_4. The deflectable actuator plate 12-4 can be, for example, configured to effect a hollow warp. Based on the different lengths of the main axis 34_4 and the minor axis 36_4, the hollow warp can be effected such that at locations of the contact areas 38a and 38b, the mechanical contact at the first abutment area is provided at a first time and at locations of the contact areas 38c and 38d, the mechanical contact is provided at the second time. If the deflectable actuator plate 12_4 is put, for example, from a planar state into a state of the hollow warp, the first time can be prior to the second time. In other words, the contacts in the contact areas 38c and 38d close after the contacts in the contact areas 38a and 38b. If the deflectable actuator plate 12_4 is put from a state where the same effects the hollow warp and where the mechanical contacts are provided into a different, for example, planar state, the contacts in the contact areas 38c and 38d can open first and the contacts in the contact areas 38a and 38b can open after that.

Alternatively, the contact areas can also be disposed within a tolerance range around the elliptical trajectory, which is determined by parallel shifts of the same. The parallel shift can have a value of less than ±25%, less than ±15% or less than ±5% of the dimension of the main axis 34_4 or the minor axis 36_4.

In other words, the hollow warp can be effected such that the four contact pairs of the mechanical contact in the contact areas 38a-d or electrodes disposed thereon are closed offset in time with the respective partner elements on the abutment areas. When operating the actuator, first, the two along the main axis and after that the two along the minor axis can be closed. Opening of the contact pairs can be performed exactly the other way round. This sequential closing and opening of several contact pairs can, for example, be used for increasing a life time of the MEMS when the MEMS is used, for example, as ohmic switch.

The respective contact forces can be dimensioned individually, for example by positioning the contact areas away from the vertexes.

Figure 2E:
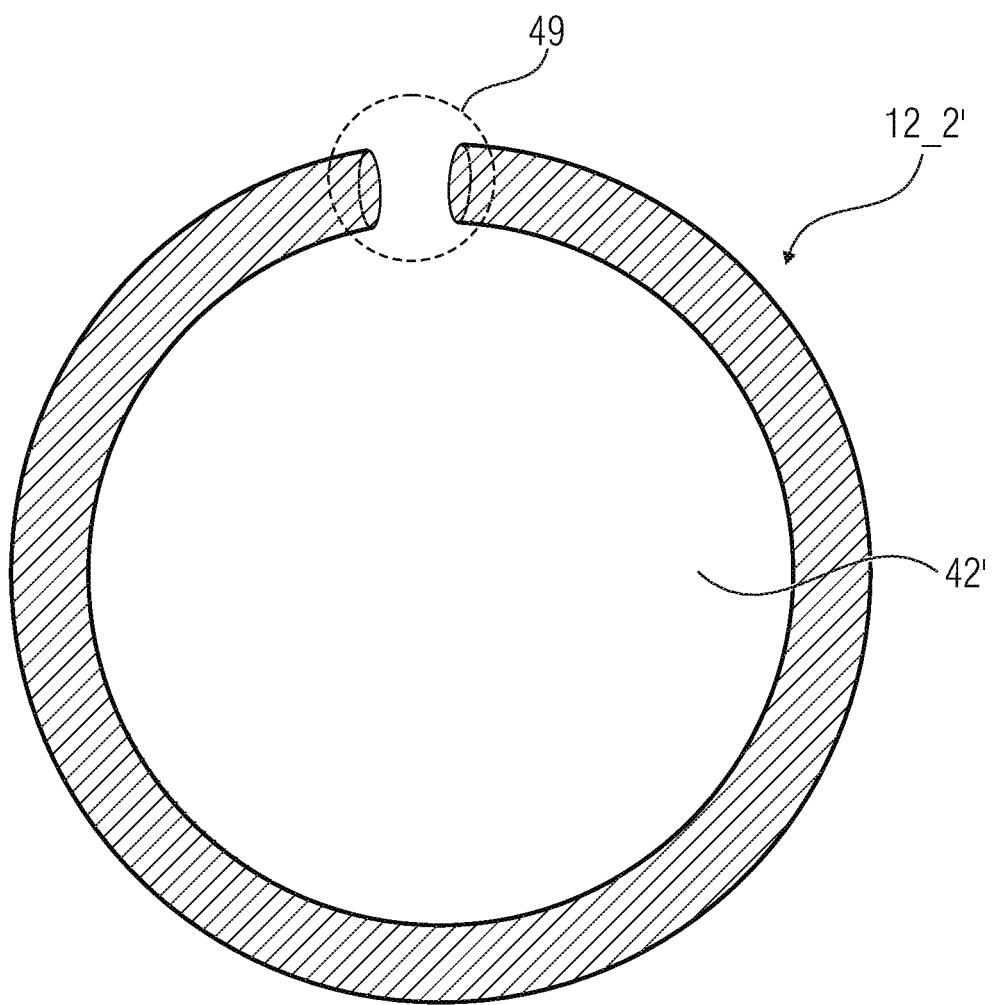
FIG. 2e is a schematic top view of a deflectable actuator plate according to an embodiment of the present invention comprising a round shape analogously to the deflectable actuator plate of FIG. 2b and whose ring-shaped structure comprises a recess.

FIG. 2e shows a schematic top view of a main side of a deflectable actuator plate 12_2' comprising a round shape analogously to the deflectable actuator plate 12_2 of FIG. 2b. A recess 42' is enlarged with respect to the recess 42, such that a width of the elliptical ring can have, for example, less than 30%, less than 20% or less than 15% of a dimension of the elliptical ring in the direction of the main or minor axis.

The deflectable actuator plate 12_2' has a recess 49, such that a ring shape of the deflectable actuator plate 12_2' is interrupted. A spring element or an anchor can be contacted at a location of the recess 49, for example.

Alternatively, the deflectable actuator plates 12_1, 12_2, 12_2', 12_3 and/or 12_4 can have a different or any geometry, for example a main side geometry with a polygonal, elliptical, round outline or an outline with polygonal, elliptical or round shapes disposed equidistantly along a circular trajectory. Based on the geometry, a position and number of contact points, areas and/or lines to be expected, where the force generated by the deflectable actuator plate is transferred to the abutment area, can change.

In other words, FIGS. 2*a-d* show different actuator geometries and possible contact areas with a first abutment area when the deflectable actuator plate effects the hollow warp. The actuators can be coupled to a first or second abutment area at the edge and/or at the center. For example, if a contact is to be established in a planar regular manner between a deflectable actuator plate and a first abutment area, a circular or ring-shaped geometry can be selected. For irregular, for example time-variable behavior of the mechanical contacts, an elliptical geometry can be advantageous. Alternatively, combinations of ring-shaped, circular and/or elliptical geometries are possible.

An actuator plate 12_1, 12_2, 12_3 and/or 12_4 can be held at any positions, for example, along the edges. The abutment areas can be dimensioned such that the same exist only in the regions where a mechanical contact is to be expected. Position and number of the contact points lines or areas can depend on the geometry of the actuator plate 12_1, 12_2, 12_3 and/or 12_4 and the respective anchoring.

It is an advantage of this embodiment that different contact materials of electrodes are used at the contact pairs. For the contact pair closing first, i.e., opening last, which includes the contacts in the contact areas 38*a* and 38*b*, a hard resistive material with comparatively high contact resistance, such as tungsten, chromium, molybdenum or carbon can be used at the electrodes. For electrodes at the contact pair closing last, i.e., opening first including the contacts in the contact areas 38*c* and 38*d*, materials that are softer, such as gold or gold alloys, but that therefore have a lower contact resistance, can be disposed. Contact discharges (micro arcs) during opening or closing of electrode contacts which can result in a plurality of aging effects, such as burning of the contact areas, can take place at the more resistive contact pair closed first. The more conductive but more sensitive contacts, for example gold contacts, in comparison, can be opened and/or closed with reduced or possibly without "micro arcing". In this way, a lower contact resistance can be ensured and at the same time a life time or capacity of the switch with respect to switching under load (hot switching) can be increased.

Figure 3:
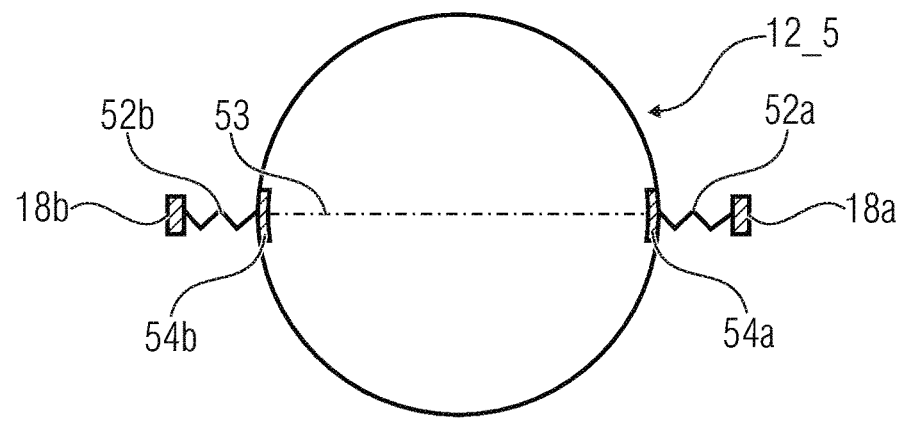
FIG. 3 shows in a top portion a schematic top view of an MEMS with a deflectable actuator plate suspended at two anchors via two spring elements, in a central portion the MEMS in a schematic side sectional view in an off-state and in a top portion a schematic side sectional view of the MEMS in the on-state according to an embodiment of the present invention.
Figure 3:
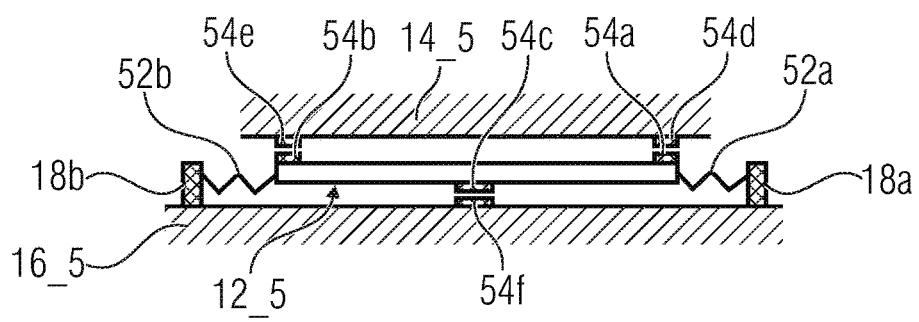
Figure 3:
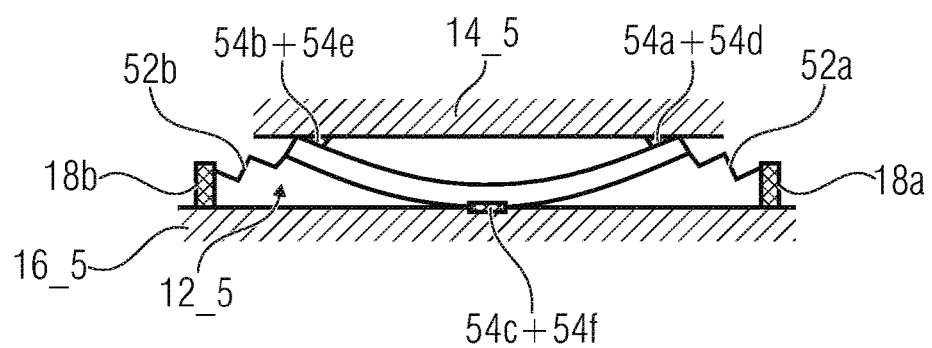

In a top portion, FIG. 3 shows a schematic top view of an MEMS 30 with a deflectable actuator plate 12_5 suspended at two anchors 18*a* and 18*b* via two spring elements 52*a* and 52*b*. The spring elements 52*a* and 52*b* are disposed along an axis 53 at the deflectable actuator plate 12_5. The axis 53 can, for example, be a main or minor axis of an elliptical ring whose area overlaps with an area of the piezoelectric functional layer. The spring elements can, for example, be formed of the same material as a substrate of the deflectable actuator plate 12_5 on which the piezoelectric functional layer is disposed. The spring elements 52*a* and 52*b* can be integrally formed with the substrate. This can be performed, for example, by an etching process during a manufacturing method of the MEMS. Electrodes 54*a* and 54*b* are disposed on the deflectable actuator plate 12_5 adjacent to the spring elements 52*a* and 52*b*. The spring elements 52*a* and 52*b* can basically have any geometry. Thus, the same can be implemented, for example, as beam springs, torsion springs and/or flexion springs.

In a central portion, FIG. 3 shows the MEMS 30 in a schematic side sectional view in an off-state. Based on spring forces of spring elements 52*a* and 52*b*, the deflectable actuator plate 12_5 is disposed spaced apart from a first abutment area 14_5 and a second abutment area 16_5.

Electrical contacts between the electrodes 54*a* and 54*b* and electrodes 54*d* and 54*e* disposed on the first abutment area 14_5 are open. An electrode 54*c* is disposed on a main side of the deflectable actuator plate 12_5 facing the second abutment area 16_5. On the second abutment area 16_5, an electrode 54*f* is disposed opposite to the electrode 54*c* and implemented to form an electric contact with the electrode 54*c* in the on-state of the deflectable actuator plate 12_5. The electrodes 54*a-f* are contact electrodes.

In a bottom portion, FIG. 3 shows a schematic side sectional view of the MEMS 30 in the on-state. Based on the hollow warp, the deflectable actuator plate 12_5 provides a mechanical contact to the first abutment area 14_5 and to the second abutment area 16_5. The spring elements 52*a* and 52*b* are connected to anchors 18*a* and 18*b*, such that the deflectable actuator plate 12_5 is supported at locations of the anchors 18*a* or 18*b* on the second abutment area 16_5.

In the on-state, apart from the mechanical contact, an electrical contact is also established between electrodes 54*a* and 54*d*, 54*b* and 54*e* and 54*c* and 54*f*. Thereby, for example, an electrical contact can be provided between the second abutment area 16_5 and the first abutment area 14_5. Alternatively, electrodes 54*a* and/or 54*b* as well as 54*d* and/or 54*e* can have another shape, for example, a ring shape and can possibly have different radii of the electrodes 54*a*, 54*b*, 54*d* and/or 54*e*.

In a volume between the first abutment area 14_5 and the second abutment area 16_5, a pressure differing from the environmental pressure can be provided, for example increased air pressure, low air pressure generated by sucking volume or even air pressure close to vacuum. Alternatively, a medium differing from air or gas can be disposed. An amended pressure or a viscosity amended with respect to air can be used for influencing a switching behavior, such as a switching velocity or a propagation of sparks or the like between opening or closing the electrodes of the MEMS 30.

In other words, placing the actuator on to the bottom bounding surface can effect shortening of the lever and stiffening of the actuator structure, wherein the moment of placing can at least partly determined by the distance between the upper and the lower bounding surface. Up to immediately prior to the placing, the actuator can behave like a comparatively long and soft actuator by which greater deflections can be realized in order to ensure closing of the contact. In the moment of placing, the level is shortened abruptly such that the actuator generates significantly increased forces due to its increased spring constant. By the placing, the actuators can have a shortened switch-on time compared to cantilevered beam elements. Additionally, susceptibility to contact bouncing can be lower than in conventional designs, for example bending beam designs.

Soft anchoring of the actuator by means of flexible springs can significantly increase actuator efficiency, i.e., a generated force in dependence on used electric energy with respect to force generation since, due to the low spring constant, merely a low amount of mechanical energy is stored in the springs. Subsequently, a large part of the mechanical energy generated in the actuator, for example the piezoelectric, can be used for force generation.

It is an advantage of this embodiment that, for example, when actuating the deflectable actuator plate 12_5 and when beginning to effect the hollow warp, a time exists where a mechanical contact is provided between the deflectable actuator plate 12_5 and the second abutment area 16_5, for example via the electrical contact at the electrodes 54c and 54f. At this time, a rigidity of the deflectable actuator plate 12_5 can increase since, compared to the state as illustrated, for example, in the central portion, a further support point between the deflectable actuator plate 12_5 and the second abutment area 16_5 is effective. Compared to the support point as provided, for example, by the anchor in FIG. 1, this embodiment can be advantageous since an area, where the anchor 18 in FIG. 1 impedes a deflection of the deflectable actuator plate 12 due to the fixed connection with the same, can be reduced. Alternatively or additionally, the electrodes 54a-f and/or the axis 54 can have a different position and/or orientation with respect to the deflectable actuator plate 12_5.

Further, it is advantageous that, based on the spring elements 52a and 52b, in particular when the spring elements have a low spring rigidity, an impediment of the deflection of the deflectable actuator plate 12_5 with respect to anchoring by means of an anchor can be reduced or prevented. If a spring element has a high spring rigidity, i.e., if the same is a rigid body, the same can be approximated or referred to as anchor.

Figure 4:
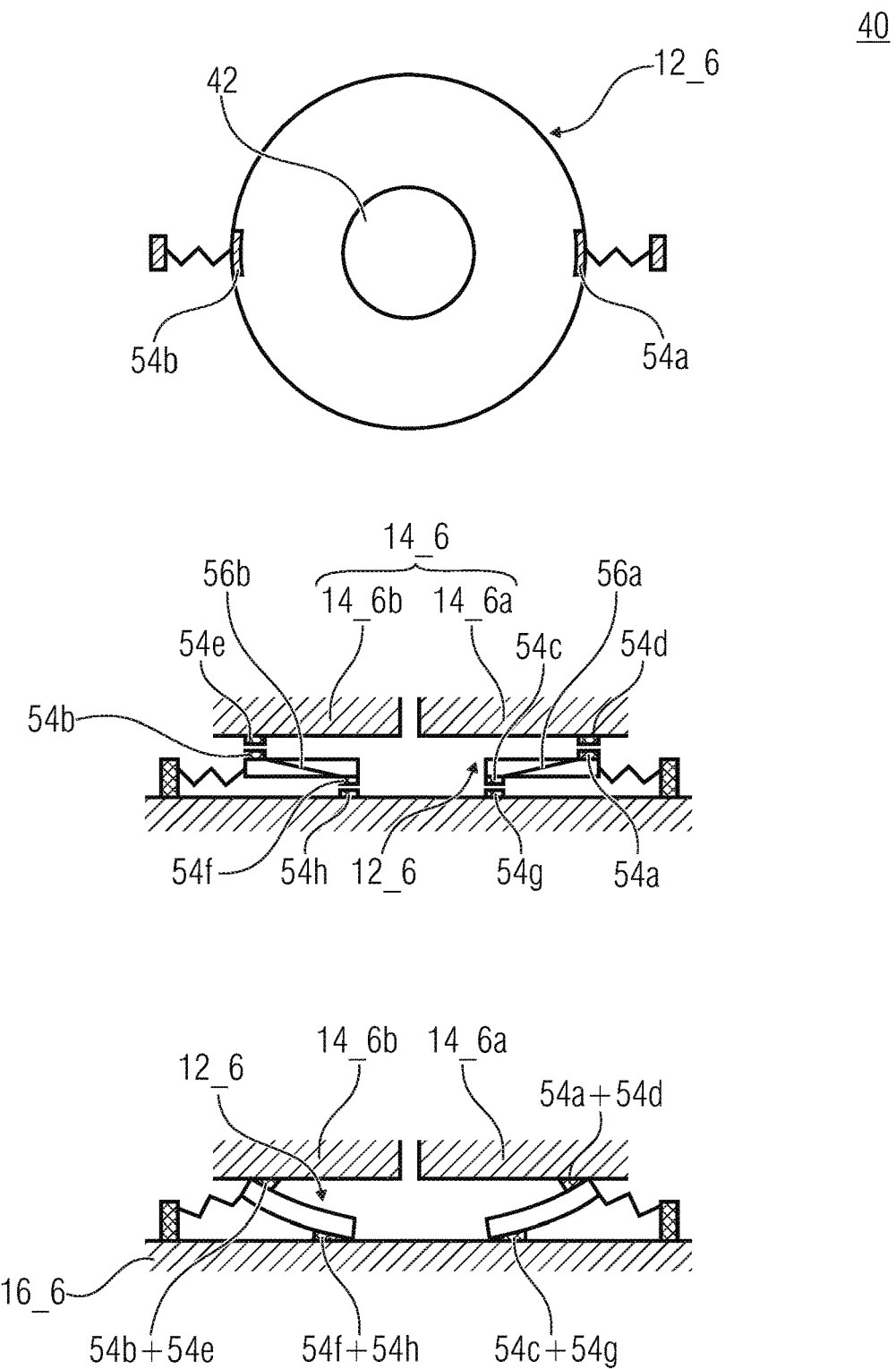
FIG. 4 shows schematic views of an MEMS whose deflectable actuator plate comprises an inner recess according to an embodiment of the present invention.

FIG. 4 shows a schematic view of an MEMS 40, wherein the MEMS 40 is shown in a top portion of FIG. 4 in a top view, in a central portion of FIG. 4 in a schematic side sectional view in an off-state and in a bottom portion in an on-state. In contrary to the MEMS 30 in FIG. 3, the deflectable actuator plate 12_6 comprises the inner recess 42.

Further, an abutment area 14_6 comprises a first subregion 14_6a and a second subregion 14_6b that are disposed spaced apart from one another. The deflectable actuator plate 12_6 comprises electrodes 54a, 54c, 54b and 54f, wherein the electrodes 54a and 54c as well as the electrodes 54b and 54f are connected to each other via circuit structures 56a or 56b. As illustrated in the bottom portion of FIG. 4, in the state where the deflectable actuator plate provides the mechanical and, hence, the electrical contact to the first abutment area 14_6, an electrical contact between the second abutment area 16_6 and the first subregion 14_6a and a further electrical contact between the second abutment area 16_6 and the second subregion 14_6b can be provided by means of contact pairs 54c+54g and 54a+54d, such that the MEMS 40, when used as an electric switch, can be used, for example, as three-pole switch. Alternatively, further contacts can be disposed on the second abutment area 16_6, on the first abutment area 14_6 and/or on the deflectable actuator plate 12_6, such that a multipole electrical contact can be established. Alternatively, for example in absence of electrodes 54c, 54g, 54f and 54h, an electrical contact can be established between the electrodes 54d and 54e at the first subregion 14_6a and the second subregion 14_6b when the deflectable actuator plate 12_6 comprises circuit structures between electrodes 54a and 54b and effects the hollow warp.

Alternative embodiments show MEMS having a number of one, two or more subregions of the first or second abutment area.

In other words, FIG. 4 shows a ring-shaped variation of the actuator suspended on springs. Alternatively or additionally, spring elements can be mounted both on the outer edge and on the inner edge of the actuator plate. If the springs are very soft and the gap between the first abutment area 14_6 and the second abutment area 16_6 is dimensioned accordingly, the actuator structure, i.e., the deflectable actuator plate 12_6, can push against the first abutment area with the outer edge and against the second abutment area 16_6 with the inner edge during operation, i.e., when effecting the hollow warp. With an increase of the spring rigidities, i.e., if the springs are harder, the respective edge can possibly remain spaced apart completely or partly from the respective abutment area, i.e., bounding surface. A number and orientation of the contact points between the deflectable actuator plate and the bounding surfaces, i.e., abutment areas, can depend on a shape of the deflectable actuator plate.

Figure 5:
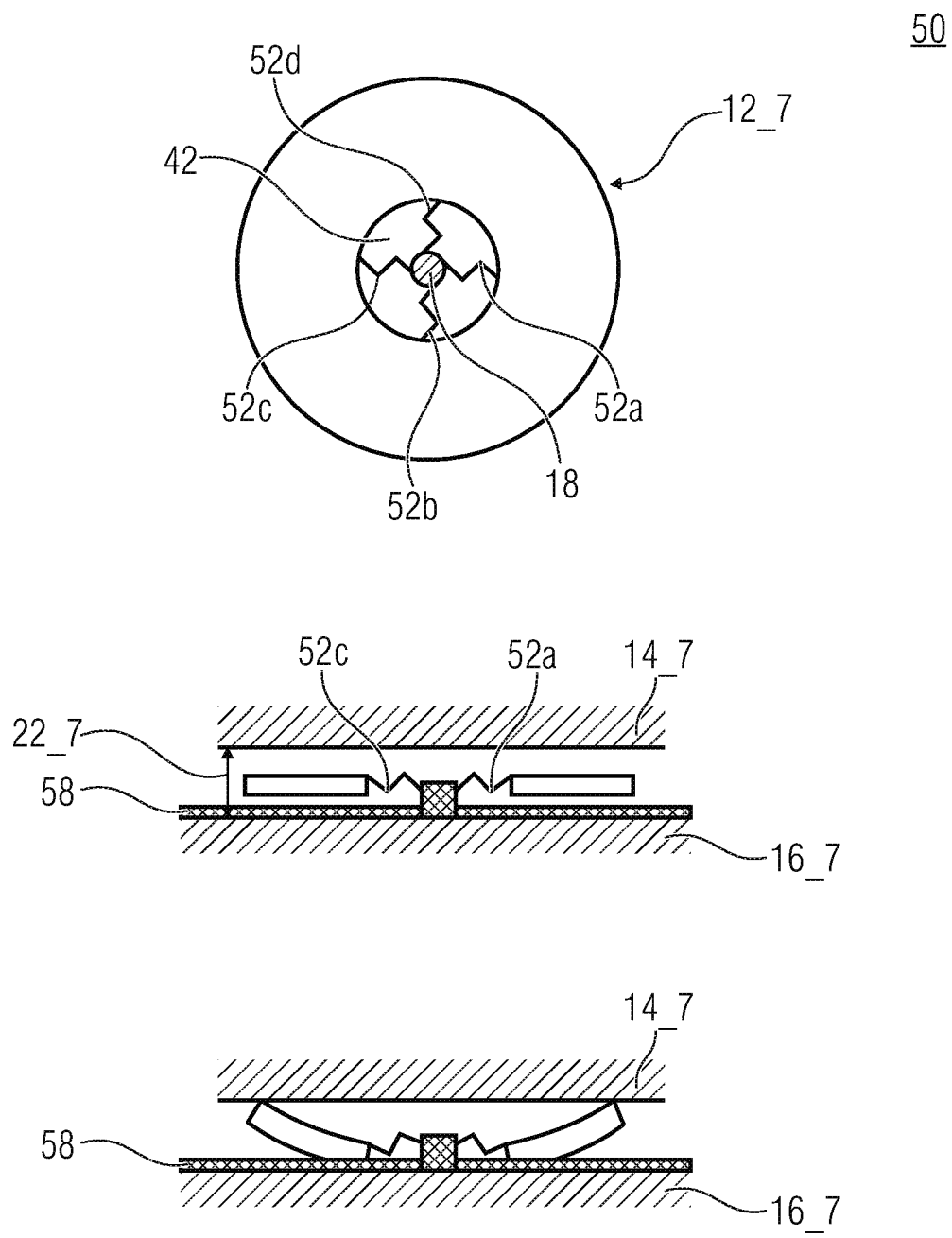
FIG. 5 shows schematic views of an MEMS comprising a stator electrode 58 according to an embodiment of the present invention.

FIG. 5 shows schematic views of a MEMS 50, wherein FIG. 5 shows, in a top portion, a top view of a deflectable actuator plate 12_7, in a central portion a schematic side sectional view of the MEMS 50 in an off-state and in a bottom portion a schematic side sectional view of the MEMS 50 in an on-state. The deflectable actuator plate 12_7 comprises the recess 42. The deflectable actuator plate 12_7 is connected to the anchor 18, which is disposed in a central area of the recess 42 or the deflectable actuator plate 12_7, via four spring elements 52a_d. This enables that the spring elements 52a-d are disposed equidistantly at an inner cladding area of the deflectable actuator plate 12_7 defined by the recess 42 and have approximately the same length. Alternatively, the anchor 18 can also be disposed at a different location and/or the spring elements 52a-d can have an angle of ≠90° to one another. Alternatively or additionally, the spring elements 52a-d can have differing spring rigidities and/or can be disposed at a different location on the deflectable actuator plate 12_7. Alternatively, the deflectable actuator plate 12_7 can be disposed on an abutment area or at one or several anchor points with one of four different numbers of spring elements.

As shown in the central and bottom portion of FIG. 5, the MEMS 50 comprises a stator electrode 58 disposed on the second abutment area 16_7 opposite to the deflectable actuator plate 12_7 in a planar manner. Applying an electrical voltage between the stator electrode 58 and one or several electrodes disposed on or in the deflectable actuator plate 12_7 allows the provision of an electrostatic field between these electrodes, such that an attractive force between the deflectable actuator plate 12_7 and the second abutment area 16_7 can be provided. The electrical voltage can, for example, be applied between the stator electrode 58 and an electrode disposed on the piezoelectric functional layer, such as the electrode 26a or 26b in FIG. 1c or an outer electrode, for example the electrode 54c. The attractive force can be greater than a holding force provided by the spring elements 52a-d, such that a mechanical contact between the second abutment area 16_7 and the deflectable actuator plate 12_7 can be provided in the off-state.

Deformation forces in the deflectable actuator plate 12_7 resulting in the hollow warp can be greater than the holding forces provided by the electrical field. Alternatively or additionally, the starter electrode 58 can be disposed opposite to merely subregions of the deflectable actuator plate 12_7 such that the attractive force is merely provided in the subregions.

Alternatively, the stator electrode 58 can also be provided on the first abutment area 14_7, for example when effecting the hollow warp results in a reduction of contact areas between the first abutment area 14_7 and the deflectable actuator plate 12_7, i.e., the hollow side is facing the second abutment area 16_7.

In other words, soft suspension via external and/or internal spring elements allows to pull the movable actuator structure, the deflectable actuator plate in the off-state by means of electrostatical forces to be flat and/or to the opposing bounding surface, i.e., abutment area in order to prevent undesired contact towards the top or in order to ensure the necessitated gap between the contacts of an ohmic switch. This can result in advantages, in particular in high frequency applications.

It is an advantage of this embodiment that based on the attractive force a gap between the first abutment area 14_7 and the deflectable actuator plate 12_7 can be defined, for example maximized. The attractive force enables that the hollow warp can be effected starting from defined gaps (for example in a planar state) between the deflectable actuator plate 12_7 and the first abutment area 14_7, since the deflectable actuator plate can have, by means of the attractive force, a maximum or minimum gap to an opposing abutment area when the actuator plate does not effect the hollow warp. This can allow exact calculation and/or maintenance of switching times between the off-state and the on-state since a gap to the first abutment area 14_7 to be bridged via the hollow warp is reproducible and constant.

In absence of the attractive force, for example due to temperature effect and/or thermal expansion, an original state, i.e., an initial gap between the deflectable actuator plate 12_7 and the first abutment area 14_7 and, hence, a switching time are variable. Alternatively or additionally, based on the attractive force, a random or undesired mechanical contact between the deflectable actuator plate 12_7 and the first abutment area 14_7 can be prevented, for example when the MEMS 50 is vibrated such that in the first state where the deflectable actuator plate 12_7 is spaced apart from the first abutment area 14_7, an undesired contact is established.

In other words, FIG. 4 and FIG. 5 show schematic cross-sections through ring-shaped actuators flexibly anchored inside or outside by means of springs and top views of the respective plates with the anchoring elements. FIGS. 4 and 5 show ring-shaped variations of an actuator suspended on springs. The springs 52a-d can be mounted both on the outer and the inner edge of the actuator plate. If the springs 52a-d are, for example, very soft and a gap between the abutment areas 14_6 or 14_7 and 16_6 or 16_7 is dimensioned accordingly, the actuator structure during operation presses in both cases with the outer edge against the top 14_6 or 14_7 and with the inner edge against the bottom bounding surface (abutment area) 16_6 or 16_7. If the springs 52a-d have a very high or approximately infinitely great rigidity, the same can be approximated by an anchor point or anchors with respect to their behavior. An orientation and the number of contact points and mounting types, i.e., springs 52a-d and/or anchors with respect to the bounding surfaces, i.e., abutment areas can depend on the shape of the respective deflectable actuator plate.

In other words, it is an advantage of this embodiment that compared to firmly anchored structures, as shown for example in FIG. 1, the actuator in the resting state can be pulled towards or down to the substrate, i.e., the second abutment area 16_7 by applying a voltage. This can be referred to as electrostatic clamping. Thereby, a necessitated minimum distance between the contact areas of a contact pair or between the deflectable actuator plate and the first abutment area can be ensured, independent of process-induced or thermally induced variations of the stress in the actuator stack.

Figure 6:
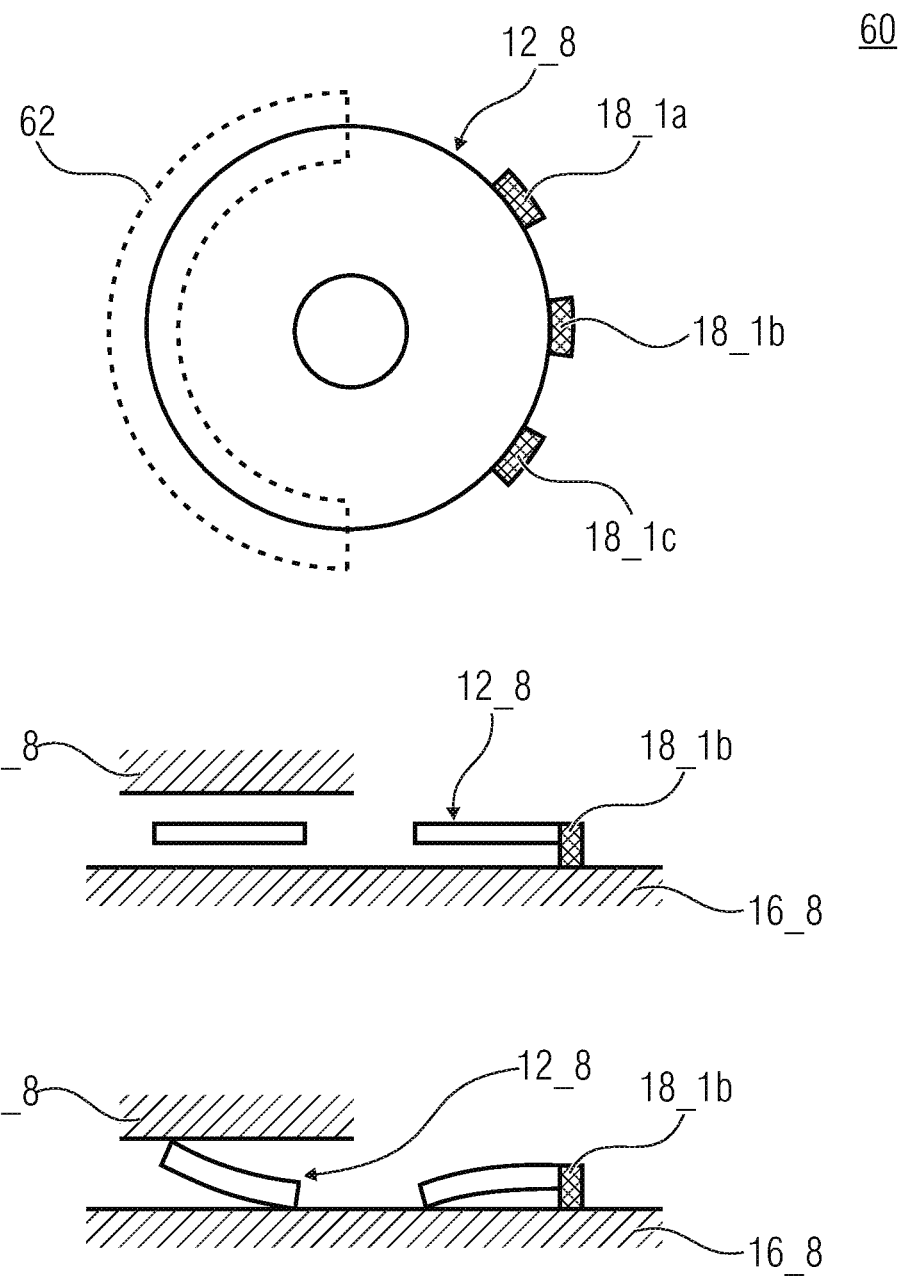
FIG. 6 shows schematic views of an MEMS with a deflectable actuator plate connected to a second abutment area via three anchors according to an embodiment of the present invention.

FIG. 6 shows a schematic illustration of an MEMS 60 with a deflectable actuator plate 12_8 which is connected to a second abutment area 16_8 by means of three anchors 18_1a, 18_1b and 18_1c.

In a top portion, FIG. 6 shows the deflectable actuator plate 12_8, the anchor points 18_1a-c as well as an area 62 where a first abutment area 14_8 illustrated in a central and bottom portion of FIG. 6 is disposed. The anchors 18_1a-c are disposed on a half of a main side of the deflectable actuator plate 12_8 which is disposed opposite to the area 62. Based on the one-sided fixed clamping, i.e., disposed on one half of the main side, the deflectable actuator plate 12_8 can be configured such that the hollow warp is at least partly suppressed on the half side where the anchors 18_1a-c are disposed. On the half side where the area 62 or the first abutment area 14_8 is disposed, the contact between the deflectable actuator plate 12_8 and the first abutment area 14_8 can be provided.

When the anchoring points, i.e., anchors 18_1a-c are disposed in a rotation-symmetric manner, the contact points, i.e., the contact area can also be disposed asymmetrically. The contact to the first abutment area 14_8 can be established, for example on the side facing away from the anchor points 18_1a-c, for example the left side in FIG. 6. In the bottom portion of FIG. 6, the deflectable actuator plate 12_8 forms a contact with the second abutment area 16_8.

In other words, in the areas where the bounding surfaces 14_8 and 16_8 are not touched by the deflectable actuator plate 12_8 in an on-state or an off-state, the same do not necessarily have to be present.

In the central and bottom portion, FIG. 6 shows schematically a ring-shaped actuator which is firmly anchored along the edges at individual points. In a top portion, FIG. 6 shows a top view of the plate 12_8 with the anchoring elements 18_1a-c and the area or region 62 where the first abutment area 14_8 is disposed.

Alternatively, the deflectable actuator plate 12_8 can be disposed on an abutment area with one of three different numbers of anchors and/or can be a deflectable actuator plate with a closed, i.e., uninterrupted, main side geometry, for example the deflectable actuator plate 12.

It is an advantage of this embodiment that an extension of the first abutment area 14_8 can be reduced. This allows, for example, material savings with respect to the first abutment area 14_8. Further, the deflectable actuator plate 12_8 can be tilted due to the one-sided anchoring in the state where the hollow warp is effected. Thereby, deflection and force on the free side can be increased. Above this, as a result of placing onto the bottom abutment area 16_8, a lever effect can occur. A further advantage is that an area of the contact area with respect to the top abutment area 14_8 may be smaller than in above embodiments. With respect to structures, such as MEMS 10 with contacts on more than one side, a contact force can be increased, since the deflection of the actuator on the other side is limited or suppressed and the contact force can be provided at the respective other (free) side.

Figure 7:
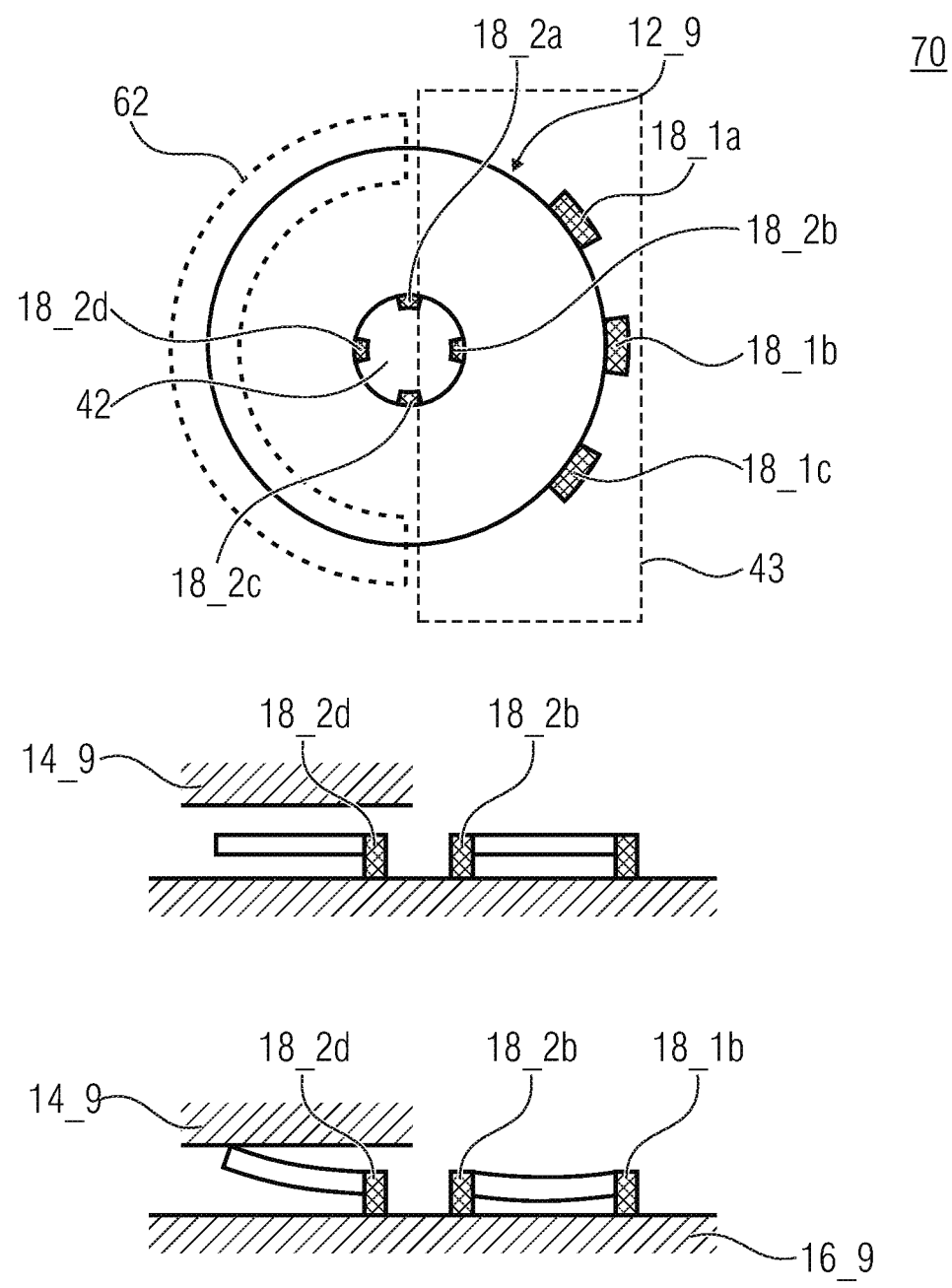
FIG. 7 shows schematic views of an MEMS with a deflectable actuator plate which is, with respect to the MEMS of FIG. 6, additionally fixed at an inner cladding area of the deflectable actuator plate by means of four inner anchor points according to an embodiment of the present invention.

FIG. 7 shows schematic views of an MEMS 70 comprising a deflectable actuator plate 12_9 which is, compared to the MEMS 60 of FIG. 6, additionally fixed by four inner anchor points 18_2a-d at an inner cladding area of the deflectable actuator plate 12_9 defined by the recess 42. With respect to deflection as illustrated in FIG. 7, a hollow warp of the deflectable actuator plate 12_9 can be reduced based on the clamping by means of the anchors 18_2a-d. In a half plane or half side 43 where the anchors 18_1a-c are disposed, a mechanical contact between the deflectable actuator plate 12_9 can be prevented based on the clamping and the second abutment area 16_9. Alternatively, the contact can also be provided between the deflectable actuator plate 12_9 and the second abutment area 16_9, for example when the hollow warp results in a bending with respective strong amplitude or when a gap by the anchors 18_1a-c and/or 18_2a-d between the deflectable actuator plate 12_9 and the second abutment area 16_9 is reduced with respect to the illustration in FIG. 7.

Alternatively, the deflectable actuator plate 12_9 can be suspended on the inner cladding area with one of four different numbers of anchors.

In other words, FIGS. 6 and 7 show variations of firmly anchored actuator structures with hard spring elements (rigid clamping) and schematic cross-sections through ring-shaped actuators which are firmly anchored along the edges at individual points as well as top views of the respective plates with the anchoring elements and the top bounding surface.

Figure 8A:
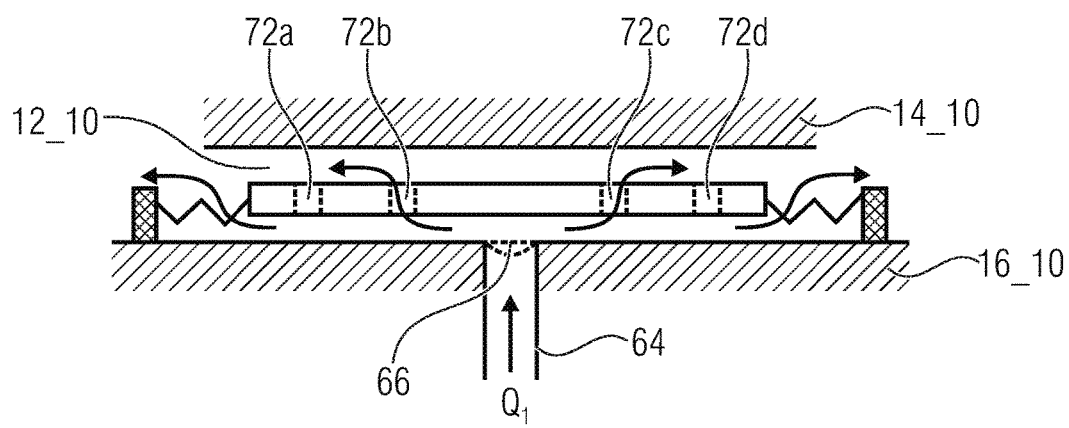
FIG. 8a is a schematic side sectional view of a micro valve comprising a deflectable actuator plate according to an embodiment of the present invention in an off-state.

FIG. 8a shows a schematic side sectional view of a micro valve 80 comprising a deflectable actuator plate 12_10. The micro valve 80 is an MEMS. The micro valve 80 comprises a fluid line 64 which is configured to guide a fluid, for example a gas or liquid, in an area between a first abutment area 14_10 and a second abutment area 16_10. The second abutment area 16_10 comprises a fluid inlet 66 which is configured to let the fluid pass into the region between the first abutment area 14_10 and 16_10. The deflectable actuator plate 12_10 comprises openings, i.e., release holes 72a-d that are configured to let the fluid pass. The deflectable actuator plate 12_10 is disposed with respect to the fluid inlet 66 such that in an off-state of the micro valve 80 a volume flow $Q_1$ can be transported through the fluid line 64. The fluid can exit the micro valve 80 through an area between the deflectable actuator plate 12_10 and the second abutment area 16_10 and can further pass the deflectable actuator plate 12_10 through the release holes 72a-d and can exit the micro valve 80 through a spacing between the first abutment area 14_10 and the deflectable actuator plate 12_10.

Figure 8B:
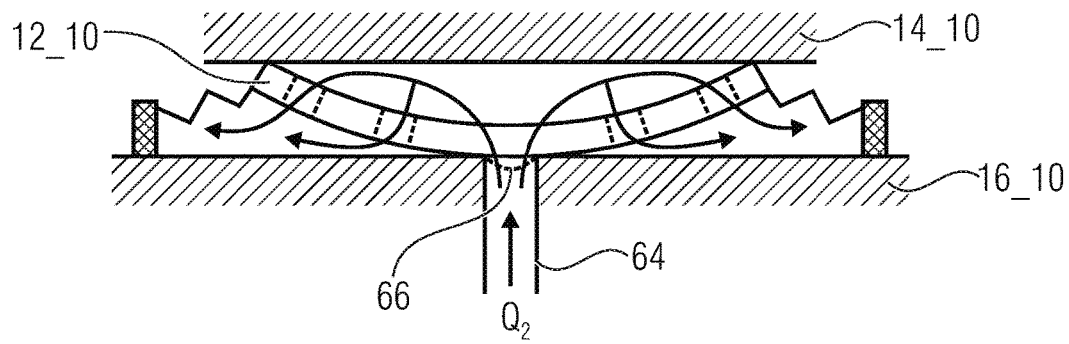
FIG. 8b is the micro valve of FIG. 8a in an on-state.

FIG. 8b shows the micro valve 80 in an on-state. Based on the hollow warp of the deflectable actuator plate 12_10, the fluid inlet 66 is at least partly closed by the deflectable actuator plate 12_10 such that a volume flow $Q_2$ can be transported through the fluid line 64. The volume flow $Q_2$ can be less than the volume flow $Q_1$. The deflectable actuator plate 12_10 can, for example, also completely close the fluid inlet 66, such that the volume flow $Q_2$ has a value of 0 or close to 0.

The micro valve 80 has a configuration which can also be referred to as "normally on", i.e., "normal state on". This means that the micro valve 80 enables a passage of the fluid with the fluid flow $Q_2$ in a non-actuated state of the deflectable actuator plate 12_10.

Alternatively, the micro valve 80 may also be implemented such that the fluid inlet 66 is at least partly closed by the deflectable actuator plate 12_10 in the off-state. This means that an actuation of the deflectable actuator plate 12_10 can result in an increased volume flow of the fluid. This configuration can be referred to as "normally off".

Alternatively, the deflectable actuator plate 12_10 can also have completely closed main surface areas, such that a fluid flow through (absent) release holes is prevented.

In other words, during contact between the actuator and the bottom bounding surface, the opening of the fluid inlet or fluid outlet can be completely enclosed.

Alternatively, the deflectable actuator plate 12_10 can also comprise a central opening such as the opening 42. In FIG. 8b, in this case, the fluid flow $Q_2$ could flow through the fluid inlet in an area between the first abutment area 14_10 and the deflectable actuator plate 12_10. When the release holes 72a-d are absent, the fluid flow $Q_2$ could exit from this area. Alternatively, an exit of the fluid flow from this area could also be prevented based on the contact forces between the first abutment area 14_10 and the deflectable actuator plate 12_10.

Figure 9A:
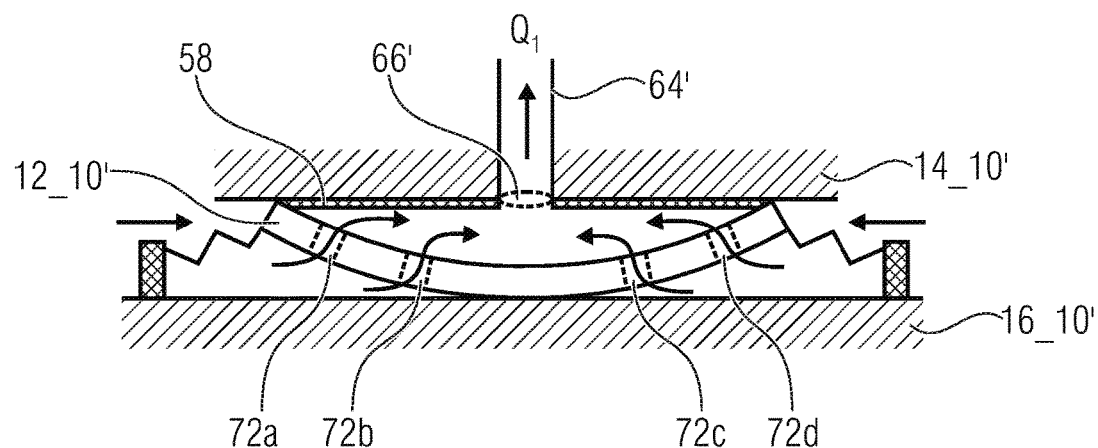
FIG. 9a is an alternative micro valve with a deflectable actuator plate in a state where the deflectable actuator plate effects the hollow warp.

FIG. 9a shows a micro valve 90 with a deflectable actuator plate 12_10' in the state where the deflectable actuator plate 12_10' effects the hollow warp. Further, the micro valve 90 comprises a fluid outlet 66' which is disposed on a first abutment area 14_10' and allows exit of the fluid with the volume flow $Q_1$ through a fluid line 64'.

Figure 9B:
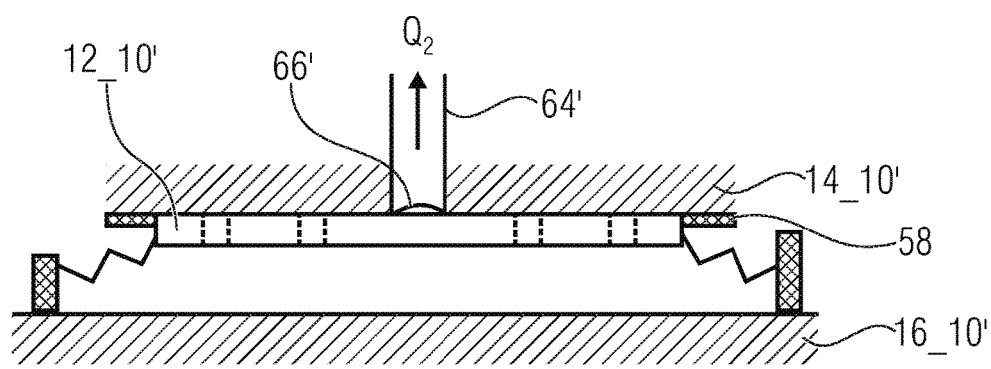
FIG. 9b is the micro valve of FIG. 9a in a state where the deflectable actuator plate comprises a planar state.

FIG. 9b shows the micro valve 90 in a state where the deflectable actuator plate 12_10' has a planar state. The stator electrode 58 is disposed on the abutment area 14_10' such that the deflectable actuator plate 12_10' can be pulled to the first abutment area 14_10' by means of attractive forces.

Based on the attractive force, the fluid outlet 66' is closed, such that the fluid flow $Q_2$ reduced with respect to the fluid flow $Q_1$ can flow through the fluid line 64'. This configuration can be referred to as "normally off".

Alternatively, a direction of the fluid flow can also be inverted, such that the fluid outlet 66 is a fluid inlet, for example the fluid inlet 66.

In other words, FIGS. 9a and 9b show a variation of a micro valve where the fluid mainly flows through the release holes.

While the micro valve 80 is implemented to reduce a fluid flow passing through the same when the deflectable actuator plate 12_10 effects the hollow warp, the micro valve 90 is configured to reduce or to prevent a fluid flow when the deflectable actuator plate 12_10' is configured in a planar manner or does not or only partly effect the hollow warp.

It is an advantage of the embodiments with the micro valves 80 or 90 that based on the contact forces between the deflectable actuator plates 12_10 or 12_10 fluids or media with high pressure are controllable since the contact forces can counteract the pressure.

Figure 10:
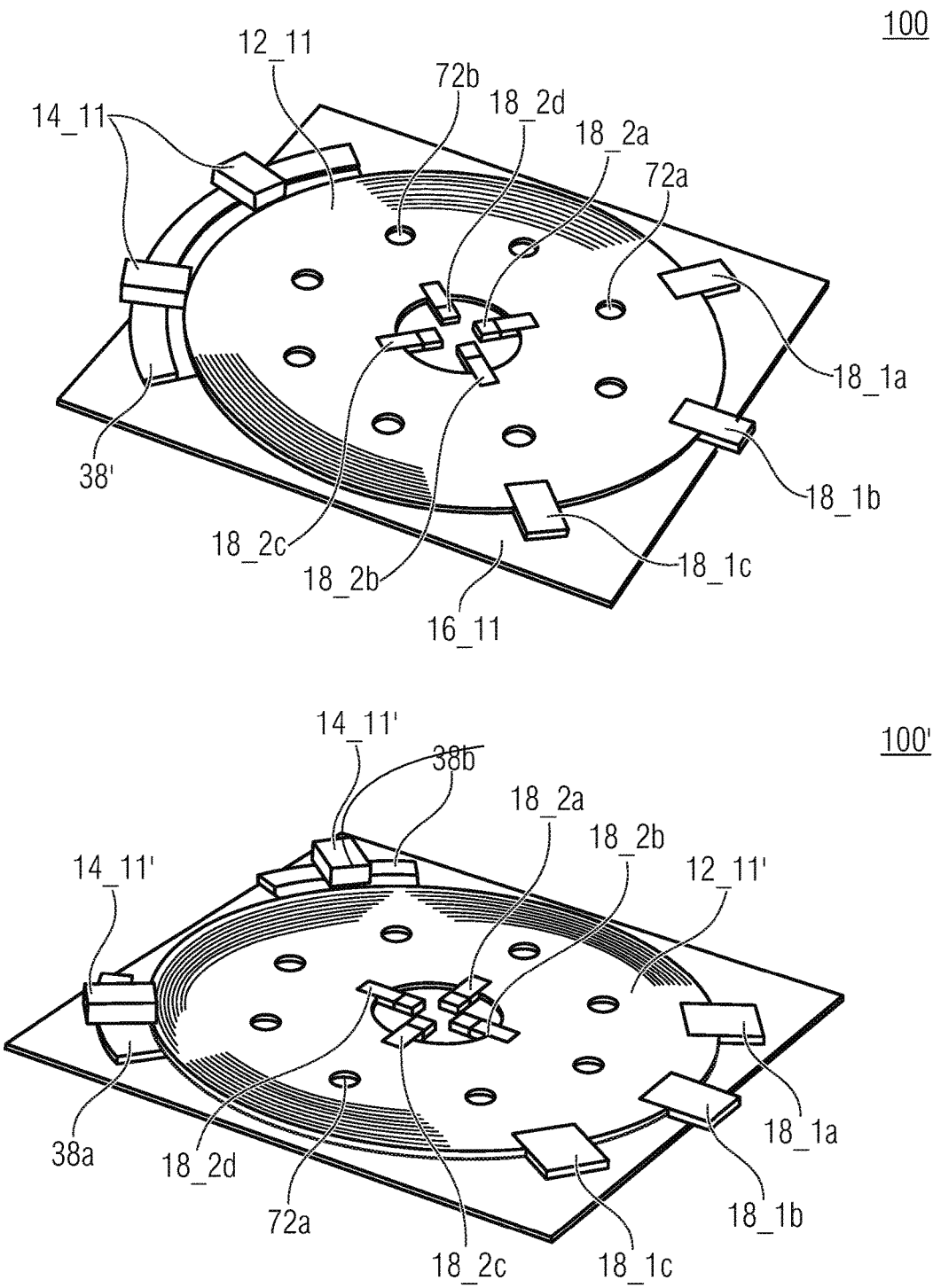
FIG. 10 shows results of a finite element modulation (FEM) of an MEMS having a structure as described for the MEMS in FIG. 7.

FIG. 10 shows in a top half of the figure results of a schematic 3D view of an MEMS 100 and in a bottom half of the figure a schematic 3D view of an MEMS 100' in a shape of a finite element modulation (FEM) having a structure as described, for example for MEMS 70 in FIG. 7.

A deflectable actuator plate 12_11 or 12_11' is disposed on a second abutment area 16_11 or 16_11' via an inner ring of four anchors 18_2a-d and also disposed on the second abutment area 16_11 or 16_11' via three anchors 18_1_a-c. Compared to an MEMS 100, MEMS 100' has varied anchor points. MEMS 100 or 100' can be produced, for example, by using surface micromechanical production technologies. The deflectable actuator plate 12_11 or 12_11' can, for example, be exposed via etching out a sacrificial layer residing below the same. For this, additional openings (release holes) 72a and 72b can be disposed in the deflectable actuator plate. Release holes allow reduction of an under-etching distance. An under-etching distance can be a distance via which a sacrificial layer is removed starting from two points accessible for etching agents. The under-etching distance can be reduced compared to an absence of release holes from a sacrificial layer that has been etched out from an edge area of the deflectable actuator plate 12_11 or 12_11' of. This means that by the release holes 72a-b a distance between locations where an etching agent or an etching solution for removing the sacrificial layers can be introduced is reduced.

The second abutment area 16_11 or 16_11', in FIG. 10 the bottom bounding surface can be formed by a silicon wafer, wherein a thickness of a bottom sacrificial layer released in FIG. 10 between the second abutment area 16_11 or 16_11' and the deflectable actuator plate 12_11 or 12_11' can determine a first partial distance between the first and second abutment areas 14_11 or 14_11' and 16_11 or 16_11', for example in a range from 0.1 to 10, from 0.2 to 5 or from 0.5 to 2 µm. The first abutment area 14_11, in FIG. 10 the top bounding surface can be formed, for example, by fixed contacts above the deflectable actuator plate 12_11 or 12_11' and can consist, for example, of thick metal, for example 5, 10 or 20 µm. "Above" the actuator plate 12_11 or 12_11' means in this context a main side of the deflectable actuator plate 12_11 or 12_11' facing away from the second abutment areas 16_11 or 16_11' of. On the deflectable actuator plate 12_11 or 12_11', matching movable contact areas, for example of metal, can be disposed in contact areas 38' or 38' and/or 38b.

The respective contact pairs can come in contact with another during a hollow warp of the deflectable actuator plate. For establishing the fixed top contacts in the abutment area 14_11 or 14_11', for example, a further sacrificial layer can be disposed above the actuator plate. A sum of thicknesses of both sacrificial layers can at least partly determine the gap, for example the gap 22 in FIG. 1. If the actuator is, for example, a PZT actuator, applying an electrical voltage to the deflectable actuator plate 12_11 or 12_11' can result in a longitudinal contraction of the same and hence to the effect of the hollow warp.

The deflectable actuator plate 12_11 or 12_11' has exemplarily a diameter of 130 µm. The bottom sacrificial layer comprises exemplarily a thickness of 0.5 µm, the top sacrificial layer a thickness of 2 µm. In other words, FIG. 10 shows results of an FEM simulation of the warping of a ring-shaped actuator with variably distributed contact or anchoring points.

The release holes 72a and 72b can be used, for example, for influencing damping characteristics based on a recess in the deflectable actuator plate 12_11 or 12_11'.

Alternative embodiments show deflectable actuator plates with a longest dimension of two arbitrary points of a main side and/or a diameter having a dimension of more than 10 µm, more than 100 µm or more than 1,000 µm.

Figure 11:
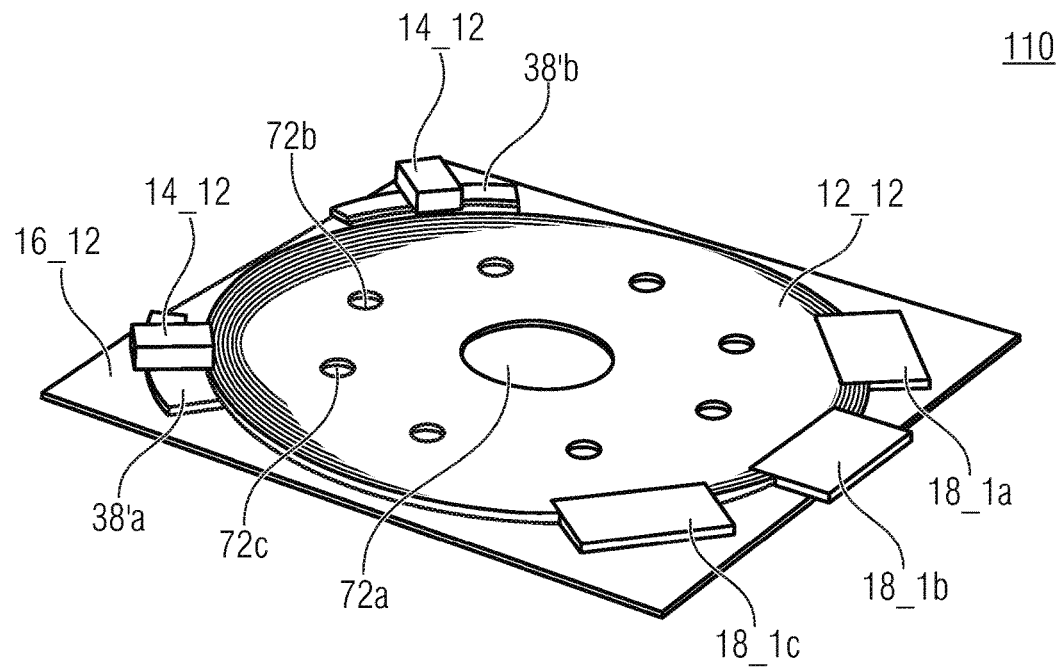
FIG. 11 shows results of FEM calculations of two MEMS having a structure analogously to the MEMS of FIG. 9 without inner anchoring points as illustrated in FIG. 6.
Figure 11:
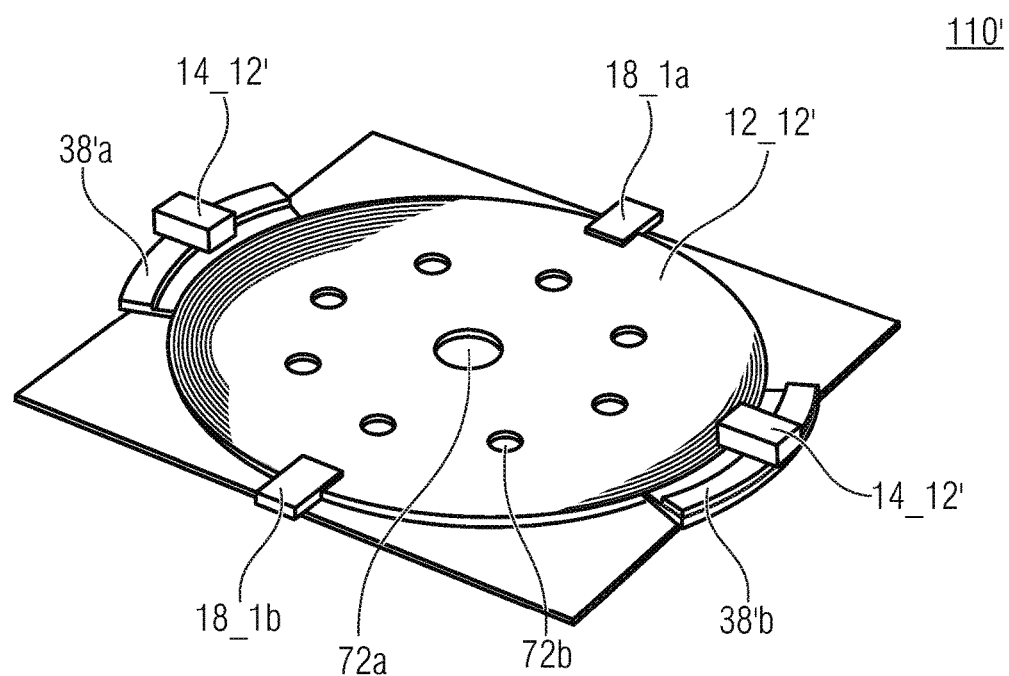

In a top half of the figure, FIG. 11 shows results of FEM calculations of an MEMS 110 or in a bottom half of the figure of an MEMS 110' with a structure analogously to the MEMS 100 or 100' but without the inner anchoring points as illustrated in FIG. 6. MEMS 110 and 110' have contact areas 38'a and 38'b that are configured to establish the mechanical contact with the first abutment area 14_12 or 14_12'. A deflectable actuator plate 12_12 or 12_12' comprises the release holes 72a, 72b and 72c, wherein the release hole 72a can correspond to the recess 42 in FIG. 4. The MEMS 110' differs from the MEMS 110 in that the anchors 18_1-c of the MEMS 110' are disposed opposite to one another in pairs, i.e., they are disposed equidistantly on the external cladding area. As illustrated in FIG. 6, the deflectable actuator plate can have a mechanical contact with the substrate, i.e., the second abutment area, in the state where the same effects the hollow warp. Thereby, the effective lever can be shortened.

In other words, FIG. 11 shows an FEM simulation of the warping of a ring-shaped actuator without inner anchoring having variably distributed contact or anchoring points.

Figure 12:
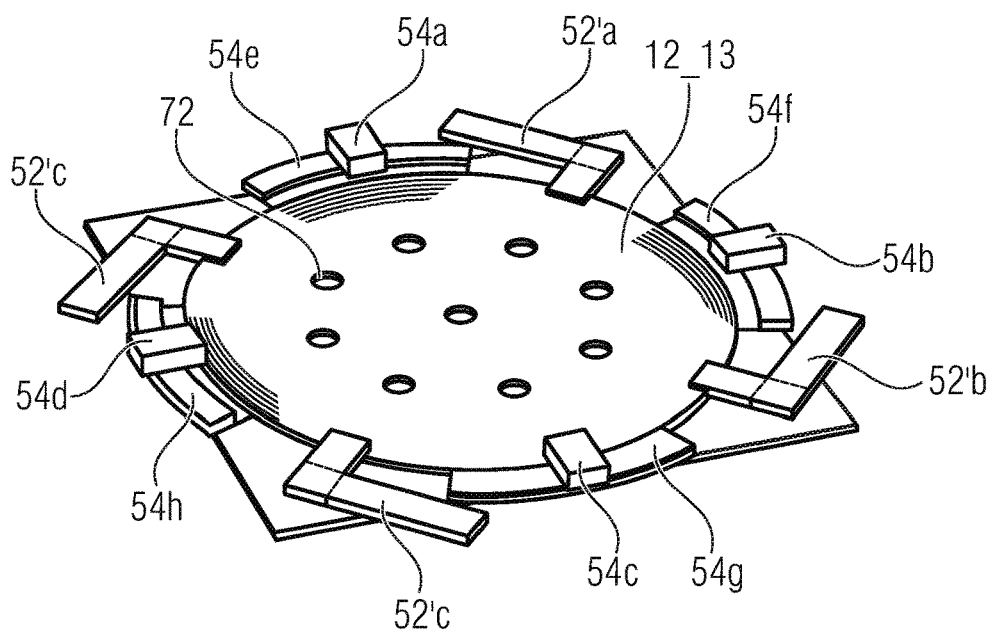
FIG. 12 shows schematic three-dimensional views of two MEMS, wherein a deflectable actuator plate of an MEMS comprises so-called "release holes" and is suspended on a non-illustrated substrate by means of four spring elements.
Figure 12:
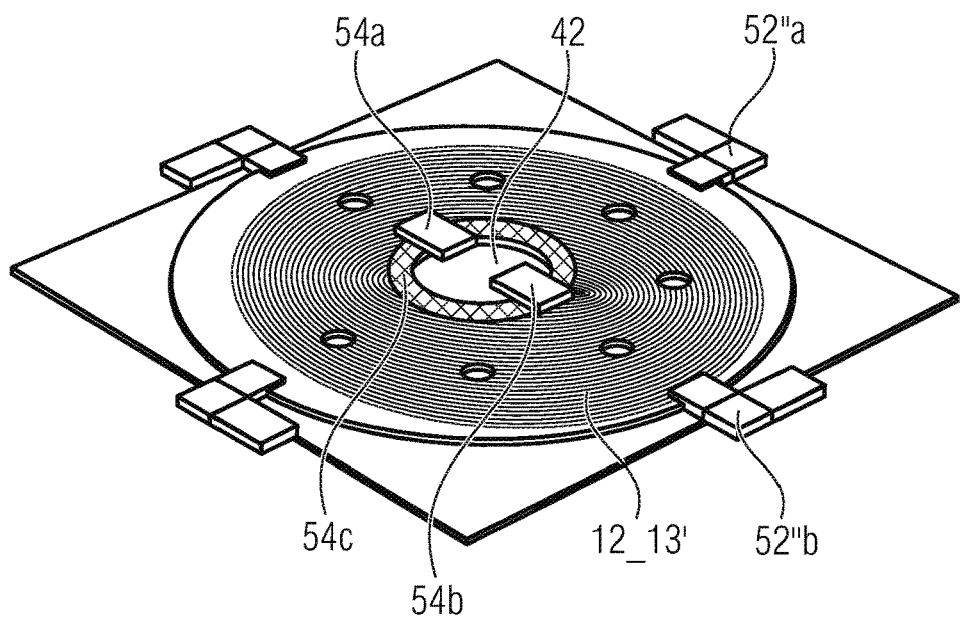

In a top half of the figure, FIG. 12 shows a schematic three-dimensional view of an MEMS 120 and in a bottom half of the figure a schematic three-dimensional view of an MEMS 120'. The MEMS 120 comprises a deflectable actuator plate 12_13 with release holes 72 and is suspended on a non-illustrated substrate by means of four spring elements 52'a-d. The spring elements 52'a-d can have any, in particular low spring rigidity having a value of, for example, at least 0.01 N/m, 0.1 N/m or 0.5 N/m and advantageously less than 500 N/m or 1,000 N/m or 5,000 N/m.

The MEMS 120' in the bottom half of the figure comprises the inner recess 42. The MEMS 120 warps, for example, with the center towards the top and the edge towards the bottom. In the MEMS 120, the contact areas or electrodes (54a-h) to the closed are disposed on or opposite to an outer region of the deflectable actuator plate 12_13, in the MEMS 120', the electrodes 54a-c are disposed along the inner region or edge. The MEMS 120 or MEMS 120' can be implemented, for example, with an MEMS 30, 40 or 50. The inner recess 42 can be used for providing an opening for etching out the sacrificial layers. The electrodes (upper fixed contacts) 54a, 54b of the MEMS 120' can be connected, for example, with the substrate, i.e., the first non-illustrated abutment area.

In other words, FIG. 12 shows an FEM simulation of the warping of ring-shaped actuators, anchored by means of soft springs (weak spring-type anchoring) along the outer edge and an actuator according to the schematic illustration in FIGS. 3 and 4. The round actuator plate is suspended along the outer edge on flexible springs that are only firmly anchored at the other end. When closing the four contact pairs, which are also disposed along the outer edge, the center of the actuator plate is pressed down against the substrate.

Figure 13:
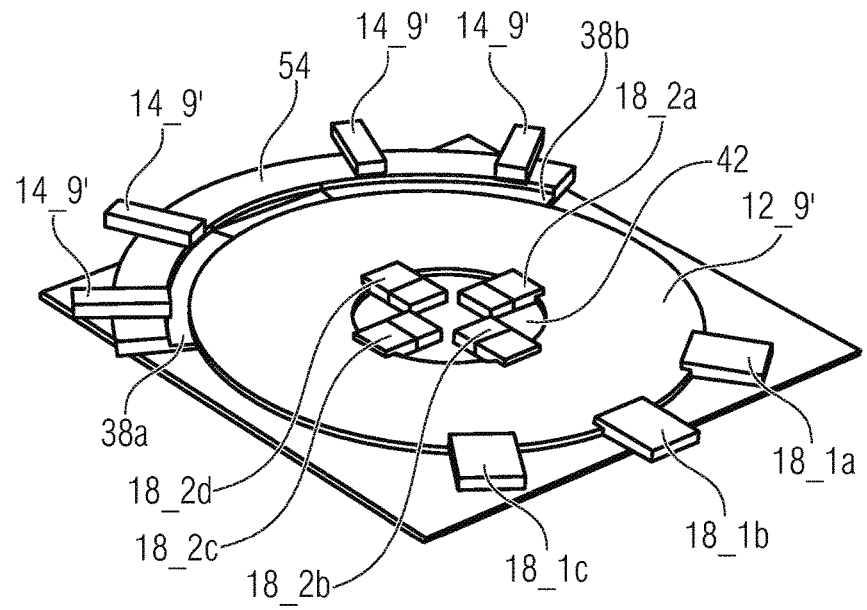
FIG. 13 shows results of FEM calculations of two MEMS with a deflectable actuator plate which comprises, with respect to the deflectable actuator plate in FIG. 7, contact areas arranged at an outer periphery of the deflectable actuator plate, which are connected via the common movable electrode.
Figure 13:
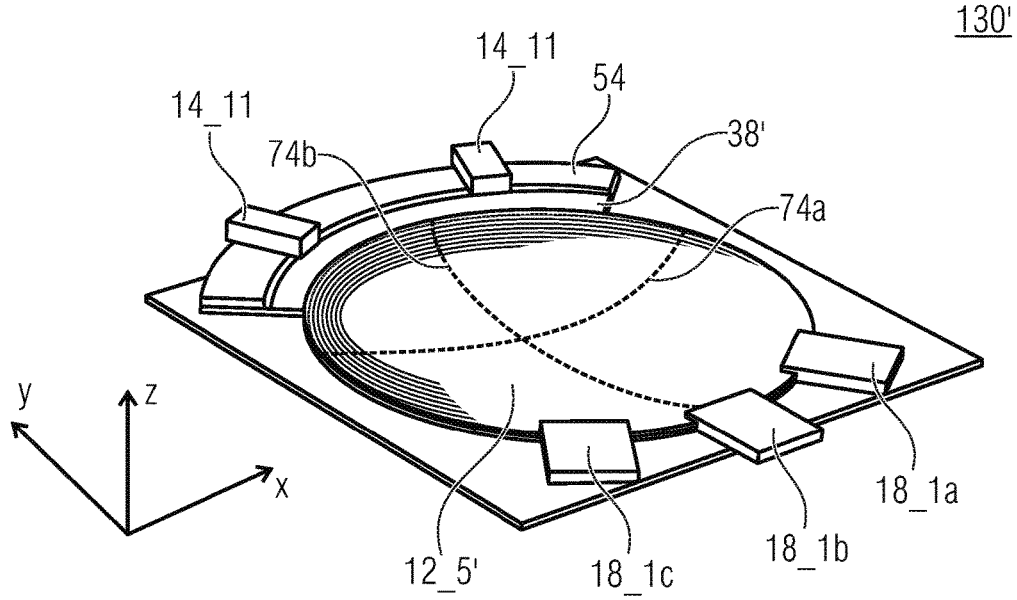

In a top half of the figure, FIG. 13 shows schematic results of FEM calculations of an MEMS 130 or, in a bottom half of the figure, of an MEMS 130'. The MEMS 130 comprises a deflectable actuator plate 12_9' which comprises, with respect to the deflectable actuator plate 12_9 in FIG. 7 contact areas 38a and 38b disposed on an outer periphery of the deflectable actuator plate, which are connected via a common movable electrode 54 disposed on the contact areas. The common movable electrode 54 is implemented to enable mechanical and possibly electrical contact with a first abutment area 14_9'.

The MEMS 130' comprises a deflectable actuator plate 12_5' which comprises, with respect to the deflectable actuator plate 12_9', a closed structure without the recess 42. The deflectable actuator plate 12_5' is suspended on an outer edge, i.e., an outer cladding area by means of the anchors 18_1a, 18_1b and 18_1c and comprises the contact area 38' as described in FIG. 10 for the MEMS 100. The anchors 18_1a-c enclose the outer cladding area and partly cover the main side area of the deflectable actuator plate facing in the direction of the first abutment area 14_11. The electrode 54 is disposed on the contact area 38', such that an electrical contact can be established between the electrode 54 and the first abutment area 14_11. As indicated by a dotted line 74a and a dotted line 74b, the MEMS 130' is illustrated in the state where the deflectable actuator plate 12_5' effects the hollow warp. The dotted lines 74a and 74 run along an x-direction or an y-direction in space, wherein the x- and the y-direction are perpendicular to one another. When effecting the hollow warp, the contact area 38 can be moved in a positive z direction which is perpendicular to the x- and y-direction in space. If the deflectable actuator plate assumes, for example, a planar state, the contact area 38 can be moved in a negative z-direction.

Figure 14:
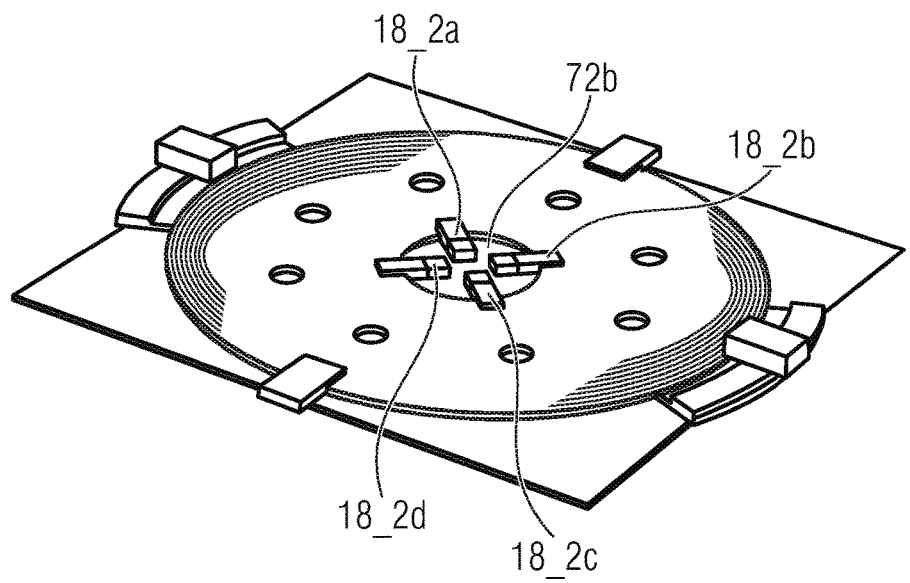
FIG. 14 shows results of FEM calculations of two MEMS, wherein one MEMS comprises, with respect to the MEMS of FIG. 11, the anchors at an inner recess of the deflectable actuator plate and the other MEMS, with respect to the MEMS of FIG. 11, comprises two further contact areas.
Figure 14:
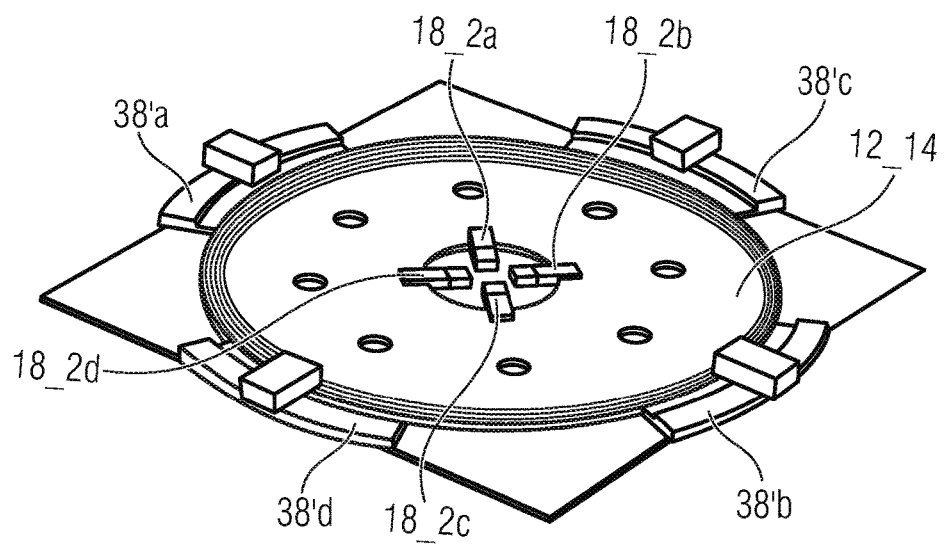

In top portion of the figure, FIG. 14 shows a schematic three-dimensional view of an MEMS 110″ which comprises, compared to the MEMS 110′ of FIG. 11, the anchors 18_2*a-d* on the inner recess or on an inner cladding area defined by a central release hole 72.

In a bottom portion of the figure, FIG. 14 shows a schematic three-dimensional view of an MEMS 110‴ which comprises, compared to the MEMS 110′ of FIG. 11, in addition to the contact areas 38′*a* and 38′*b* the two contact areas 38′*c* and 38′*d* and is merely suspended via the anchors 18_2*a-d* as described for the MEMS 110″. The contact areas 38′*a-d* are, for example, disposed equidistantly and opposite to one another in pairs on a deflectable actuator plate 12_14.

If an MEMS according to the above embodiments is used, for example, as ohmic switch, the abutment area, in contact points, lines or areas, can selectively consist of conductive materials or can comprise the same or can be coated in a conductive manner. The respective regions on the deflectable actuator plate can also be conductive or be coated in a conductive manner. In this way, when operating the actuator in the points of touch with an abutment area, a current path can be closed, for example, between two conductive regions of the respective abutment area. This function can correspond to the function of an ohmic switch, for example, a relais.

While the deflectable actuator plate has been described as being deflectable based on the piezoelectric effect in the above embodiments, other drive principles are also possible, for example thermal actuation by using different thermal coefficients of expansion during a temperature change.

The described actuator structures can be suitable, for example, for applications where high forces are to be generated by means of piezoelectric drives. This can, in particular, be applied to MEMS switches but can also be transferred to other fields of application, such as micromechanical valves.

The above-stated embodiments show deflectable actuator plates with a main side geometry having a first dimension along a first direction of extension, for example along a diameter of a lateral extension, such as a greatest or smallest edge length of the main side or a main or minor axis, for example when the deflectable actuator plate has an elliptical surface geometry. Along a second direction of extension, which is disposed perpendicular to the first direction of extension along the main side, the deflectable actuator plate has a second dimension. The first and second dimensions have a ratio with a value between greater than or equal to 0.25 and less than or equal to 4. Alternative embodiments have a ratio with a value of greater than or equal to 0.3 and less than or equal to 3 or greater than or equal to 0.35 and less than or equal to 2.85. In other words, an actuator plate has a specific width with respect to a length of the actuator plate.

While some aspects have been described in the context of an apparatus, it is obvious that these aspects also represent a description of the respective method, such that a block or device of an apparatus can also be considered as a respective method step or as a feature of a method step. Analogously, aspects that have been described in the context of one or as a method step also represent a description of a respective block or detail or feature of a respective apparatus.

While the option of electrostatic clamping has merely been described in the context of the MEMS 50 in FIG. 5, it is obvious that an arrangement of a stator electrode can also be disposed in other embodiments.

While the above embodiments have been described such than anchors are disposed on inner or outer or peripheral or cladding areas at a respective deflectable actuator plate, anchors can also project into a main side of the respective deflectable actuator plate, such that the cladding area is partly enclosed by the respective anchor. The deflectable actuator plate can be formed integrally with the anchor elements, such that a continuous material transition exists between anchor and the deflectable actuator plate.

While in the above embodiments a differentiation has been made between anchor (elements) and spring elements, it is obvious that an effect of the spring elements, spring rigidity, can also exist in anchor elements, but to a greater extent. The respective other element, i.e., an anchor or spring element, is alternatively or additionally also possible at regions of abutment areas and/or deflectable actuator plates where, in the above embodiments, the disposal of a spring element or an anchor has been described.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] Polcawich et al. "Surface Micromachined Microelectromechancial Ohmic Series Switch Using Thin-Film Piezoelectric Actuators", IEEE TRANSACTIONS ON MICROWAVE THEORY AND TECHNIQUES, VOL. 55, NO. 12, DECEMBER 2007
[2] Nakatani et al. "PZT-Actuated Reliable RF-MEMS Switch Using Single-Crystal Silicon Asymmetric Beam", Proceedings of the Asia-Pacific Microwave Conference 2011

The invention claimed is:
1. MEMS comprising:
a deflectable actuator plate; and
an abutment area;
wherein an integral piezoelectric functional layer of the deflectable actuator plate is configured across an active area of the deflectable actuator plate;
wherein the deflectable actuator plate comprises a controlled state (on-state) and a non-controlled state (off-state) and effects a hollow warp in at least one of the two states;
wherein the abutment area of a hollow side is disposed facing a hollow side of the deflectable actuator plate;
wherein the deflectable actuator plate is configured to provide in the state in which the same effects the hollow warp, mechanical contact between the deflectable actuator plate and the abutment area; and
wherein the deflectable actuator plate is spaced apart from the abutment area in the other state;
wherein an elliptical ring exists, which overlaps by more than 95% with the active area and whose elliptical ring area takes up at least 60% of a total area of the deflectable actuator plate;
wherein the elliptical ring comprises an outer elliptical trajectory with a main axis and a minor axis disposed perpendicularly to the main axis; and
wherein a ratio between the main axis and the minor axis comprises a value in the range of greater than or equal to 0.25 and less than or equal to 4.

2. MEMS according to claim 1, wherein a first direction and a second direction of the hollow warp are disposed linearly independent of one another in a main side of the deflectable actuator plate.

3. MEMS according to claim 1, wherein the deflectable actuator plate comprises a dimension along a first direction of extension and a dimension along a second direction of extension, wherein the first and second directions of extension are disposed perpendicularly to one another along a main side of the deflectable actuator plate and wherein a ratio of the two dimensions comprises a value in a range of greater than or equal to 0.25 and less than or equal to 4.

4. MEMS according to claim 1, further comprising a further abutment area disposed opposite to the abutment area, wherein the deflectable actuator plate is suspended between the abutment areas such that in the state in which the controllable actuator plate effects the hollow warp, a mechanical contact can be provided between the controllable actuator plate and the further abutment area.

5. MEMS according to claim 1, wherein the deflectable actuator plate comprises, in the state (off-state) where the deflectable actuator plate is spaced apart from the abutment area, a plurality of contact areas which are disposed on a circular or elliptical trajectory, wherein the contact areas are configured to establish the mechanical contact with the abutment area.

6. MEMS according to claim 1, wherein the abutment area comprises a first subregion and a second subregion spaced apart from the first subregion, wherein the deflectable actuator plate is implemented, in the state where the same effects the hollow warp, to provide the mechanical contact between the deflectable actuator plate and the first subregion and between the deflectable actuator plate and the second subregion.

7. MEMS according to claim 1, wherein the deflectable actuator plate, in the state in which the deflectable actuator plate is spaced apart from the abutment area, comprises a main side geometry comprising a polygonal, elliptical, round outline or an outline defined by polygonal, elliptical or round shapes arranged equidistantly along a circular trajectory.

8. MEMS according to claim 1, wherein the deflectable actuator plate comprises a main side geometry with an inner recess.

9. MEMS according to claim 1, further comprising an electrode disposed on the abutment area or on a further abutment area, such that an electric field can be generated between the electrode and the deflectable actuator plate, wherein the deflectable actuator plate is configured to effect, based on the electrostatic field, a movement in the direction of the electrode, wherein the further abutment area is disposed opposite to the abutment area, such that the deflectable actuator plate is disposed between the abutment area and the further abutment area.

10. MEMS according to claim 1, wherein the deflectable actuator plate is a bimorph comprising a substrate, a first electrode that covers the substrate at least partly, piezoelectric material that covers the first electrode at least partly and a second electrode that covers the piezoelectric material at least partly.

11. MEMS according to claim 1, comprising a further abutment area disposed opposite to the first abutment area and wherein the deflectable actuator plate is suspended on the further abutment area by means of anchor elements;
wherein the anchor elements are disposed on a half side of the deflectable actuator plate on an outer cladding area of the deflectable actuator plate.

12. MEMS according to claim 1, comprising a further abutment area disposed opposite to the first abutment area and wherein the deflectable actuator plate is suspended on the further abutment area by means of anchor elements;
wherein the anchor elements are disposed on an inner cladding area of the deflectable actuator plate.

13. Electrical circuit, comprising:
an MEMS according to claim 1; and
a control unit coupled to the MEMS and configured to control the deflectable actuator plate.

* * * * *

UNITED STATES PATENT AND TRADEMARK OFFICE
CERTIFICATE OF CORRECTION

PATENT NO. : 10,373,790 B2
APPLICATION NO. : 15/235462
DATED : August 6, 2019
INVENTOR(S) : Thomas Lisec et al.

It is certified that error appears in the above-identified patent and that said Letters Patent is hereby corrected as shown below:

On the Title Page

Item (73) Assignee: Please change "Fraunhofe-Gesellschaft zur Foerderung der angewandten Forschung e.V." to --Fraunhofer-Gesellschaft zur Foerderung der angewandten Forschung e.V.--.

Signed and Sealed this
First Day of October, 2019

Andrei Iancu
*Director of the United States Patent and Trademark Office*